(12) United States Patent
Suzuki et al.

(10) Patent No.: US 10,677,844 B2
(45) Date of Patent: Jun. 9, 2020

(54) SEMICONDUCTOR DEVICE AND TEST METHOD FOR SEMICONDUCTOR DEVICE

(71) Applicant: Renesas Electronics Corporation, Tokyo (JP)

(72) Inventors: Iwao Suzuki, Tokyo (JP); Naoki Kato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 2 days.

(21) Appl. No.: 15/954,665

(22) Filed: Apr. 17, 2018

(65) Prior Publication Data

US 2018/0313894 A1 Nov. 1, 2018

(30) Foreign Application Priority Data

Apr. 28, 2017 (JP) .................... 2017-089114

(51) Int. Cl.
| | | |
|---|---|---|
| *G01R 31/00* | (2006.01) | |
| *G01R 31/3177* | (2006.01) | |
| *G06F 11/22* | (2006.01) | |
| *G11C 29/38* | (2006.01) | |
| *G01R 31/317* | (2006.01) | |
| *G11C 29/32* | (2006.01) | |

(52) U.S. Cl.
CPC ... *G01R 31/3177* (2013.01); *G01R 31/31724* (2013.01); *G06F 11/2284* (2013.01); *G11C 29/32* (2013.01); *G11C 29/38* (2013.01)

(58) Field of Classification Search
None
See application file for complete search history.

(56) References Cited

U.S. PATENT DOCUMENTS

| | | | |
|---|---|---|---|
| 9,086,451 B2 | 7/2015 | Wada et al. | |
| 2002/0138801 A1* | 9/2002 | Wang ............... | G01R 31/31704 714/729 |
| 2007/0136626 A1* | 6/2007 | Chung .................. | G11C 29/44 714/718 |
| 2017/0205462 A1* | 7/2017 | Mukherjee ..... | G01R 31/318555 |
| 2019/0171536 A1* | 6/2019 | Refaeli ................. | G06F 11/203 |

FOREIGN PATENT DOCUMENTS

JP 2013-253840 A 12/2013

OTHER PUBLICATIONS

C. Hamilton, S. Wijesuriya, G. Gibson and C. Stroud, "Methods for boundary scan access of built-in self-test for field programmable gate arrays," Proceedings IEEE Southeastcon'99. Technology on the Brink of 2000 (Cat. No. 99CH36300), Lexington, KY, USA, 1999, pp. 210-216. (Year: 1999).*

* cited by examiner

*Primary Examiner* — Daniel F. McMahon
(74) *Attorney, Agent, or Firm* — Mattingly & Malur, PC

(57) ABSTRACT

A logic BIST circuits concurrently execute a first scan test for a scan chain as a target and a second scan test for a scan chain as a target, when they are set to a an LBIST mode, and execute the first scan test without executing the second scan test, when they are set to a simultaneous test mode. Memory BIST circuits execute a test for memory circuits concurrently with the first scan test, when they are set to the simultaneous test mode.

13 Claims, 17 Drawing Sheets

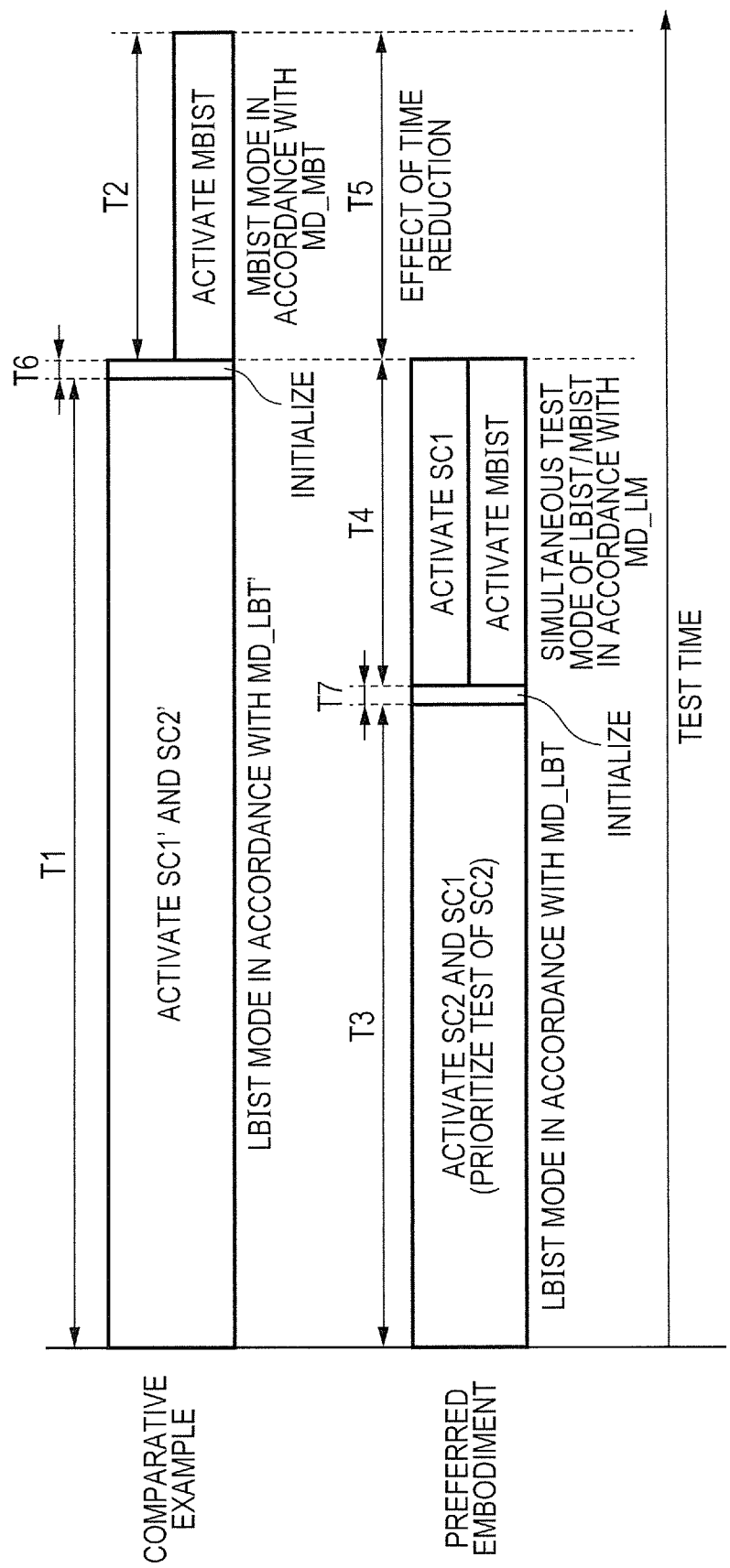

FIG. 9

| LBT_EN1 | MBT_EN | LBT_EN2 | SC_EN1 | OPERATION MODE |
|---|---|---|---|---|
| 1 | 0 | 1 | 0/1 | LBIST MODE (MD_LBT) |
| 1 | 1 | 0 | 1 | SIMULTANEOUS TEST MODE OF LBIST/MBIST (MD_LM) |
| 0 | 0 | 0 | 0 | USER MODE |

SEMICONDUCTOR DEVICE AND TEST METHOD FOR SEMICONDUCTOR DEVICE

CROSS-REFERENCE TO RELATED APPLICATIONS

The disclosure of Japanese Patent Application No. 2017-089114 filed on Apr. 28, 2017 including the specification, drawings and abstract is incorporated herein by reference in its entirety.

BACKGROUND

The present invention relates to a semiconductor device and a test method for a semiconductor device, and relates, for example, to a technique for a semiconductor device on which a BIST (Built In Self Test) circuit is mounted.

Japanese Unexamined Patent Application Publication No. 2013-253840 discloses a method for realizing a BIST in a state where a semiconductor integrated circuit is mounted on a user system, using a BIST circuit which can be controlled with a JTAG interface in a semiconductor integrated circuit. Specifically, it includes a Power-On Self-Test circuit, a pattern generation circuit, a logic BIST circuit, and a memory BIST circuit. When a self-test execution signal is asserted, the Power-On Self-Test circuit selects an output of the pattern generation circuit in place of an external terminal group of a test access port, and supplies a test pattern generated by the pattern generation circuit to each BIST circuit.

SUMMARY

For example, with the advent of ISO26262 as a functional safety standard for automobiles, there has been an increase in semiconductor devices on which a BIST circuit detecting its self-fault is mounted. As described in Japanese Unexamined Patent Application Publication No. 2013-253840, on a semiconductor device (such as a micro controller including a logic circuit and a memory circuit), a logic BIST circuit testing the logic circuit and a memory BIST circuit testing the memory circuit are mounted. In this specification, the logic BIST circuit is called an LBIST circuit, and a test (specifically, a scan test) of the logic circuit by the LBIST circuit is called an LBIST. The memory BIST circuit is called an MBIST circuit, and the test for the memory circuit by the MBIST circuit is called an MBIST.

The LBIST and the MBIST are executed when the semiconductor device boots (in other words, at the time of power supply), using the Power-On Self-Test circuit described in Japanese Unexamined Patent Application Publication No. 2013-253840. Thus, to reduce the boot time of the semiconductor device and the boot time of the system for automobiles on which this semiconductor device is mounted, it is desired to reduce the time required for the self-test. The LBIST and the MBIST are generally executed in a serial procedure. If the tests are executed in this serial procedure, the time required for the self-test may not be sufficiently reduced.

Preferred embodiments as will be described below have been made in consideration of the above. Other objects and new features will be apparent from the following descriptions of this specification and the accompanying drawings.

According to an embodiment, there is provided a semiconductor device comprising, a memory circuit unit including a memory circuit and an interface for test for the memory circuit, a logic circuit, a memory BIST circuit which tests the memory circuit, and a logic BIST circuit which tests the logic circuit and the memory BIST circuit. At least a part of the logic circuit is incorporated in a first scan chain. The memory BIST circuit is incorporated in a second scan chain. The logic BIST circuit concurrently executes a first scan test for the first scan chain as a target and a second scan test for the second scan chain as a target, when it is set to a first test mode, and executes the first scan test without executing the second scan test, when it is set to a second test mode. The memory BIST circuit executes a test for the memory circuit concurrently with the first scan test, when it is set to the second test mode. A time for executing the first scan test is longer than a time for executing the second scan test. The logic BIST circuit completes a test with the first test mode, at a stage where the second scan test has been completed.

According to the one embodiment, it is possible to reduce the time required for the self-test.

BRIEF DESCRIPTION OF THE DRAWINGS

FIG. 7 is a pattern diagram illustrating an example of the effect when the semiconductor device according to the first embodiment of the present invention is used.

FIG. 9 is a diagram illustrating examples of states of various control signals in FIG. 8A.

DETAILED DESCRIPTION

Figure 1:
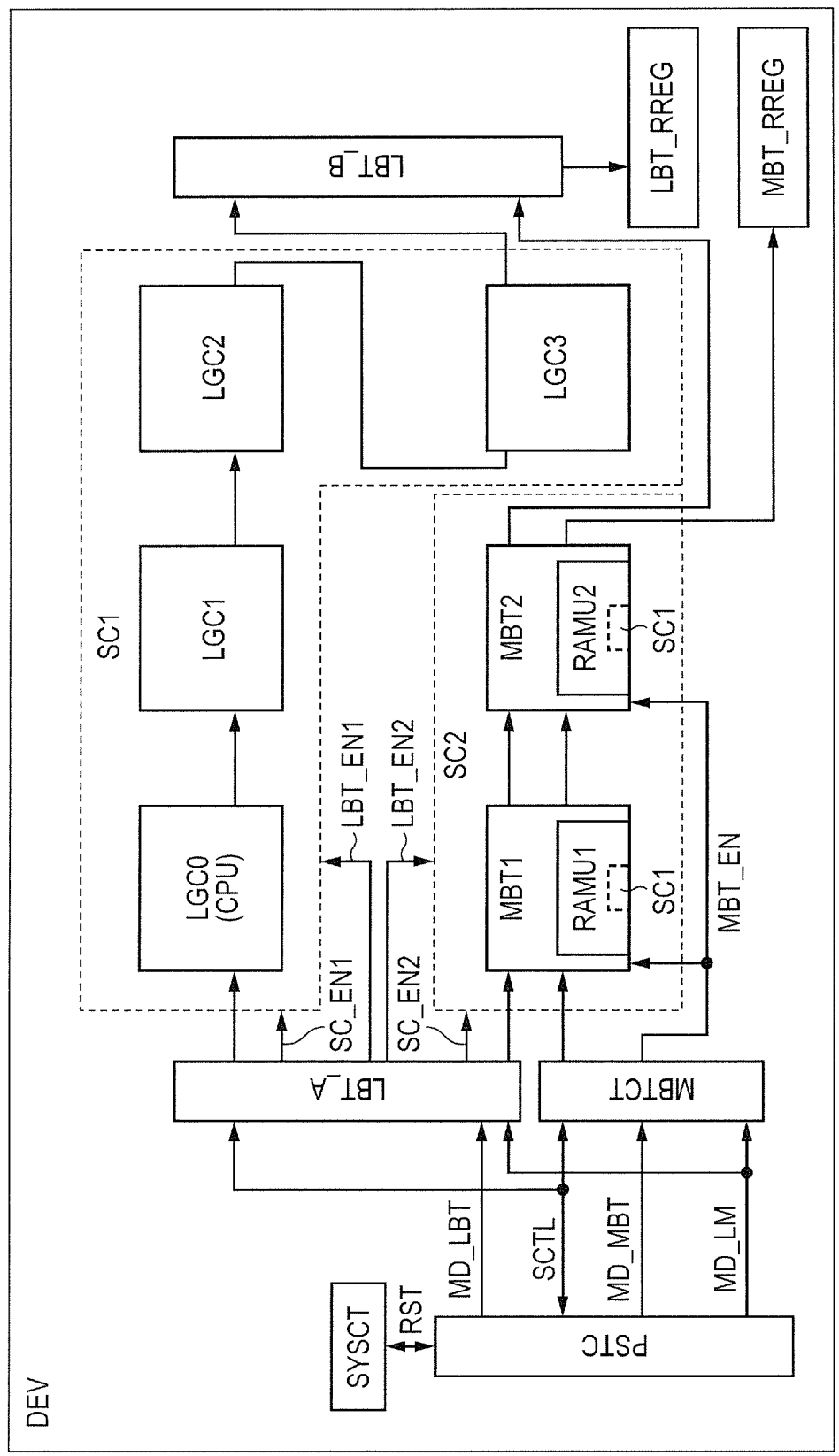
FIG. 1 is a schematic diagram illustrating a configuration example of the main part of a semiconductor device according to the first embodiment of the present invention.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of a part or whole of the other. In the following preferred embodiments, in the case of reference to the number of elements (including the quantity, numeric value, amount, range), unless otherwise specified and unless clearly limited in principle, the present invention is not limited to the specified number, and a number over or below the specified one may be used.

Further, in the following preferred embodiments, the constituent elements (including the element steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values and the range.

Though no particular restriction is made, circuit elements included in each functional block of the preferred embodiments are formed on a semiconductor substrate, like single crystal silicon, using an integrated circuit technology, such as a well-known CMOS (Complementary MOS transistor).

Descriptions will now specifically be made to the preferred embodiments of the present invention based on the illustrations. In the drawings below for explaining the preferred embodiments, the same constituent elements are identified by the same reference symbols, and thus may not be described over and over.

First Embodiment

<<Scheme of LBIST Circuit and MBIST Circuit>>

Figure 13A:
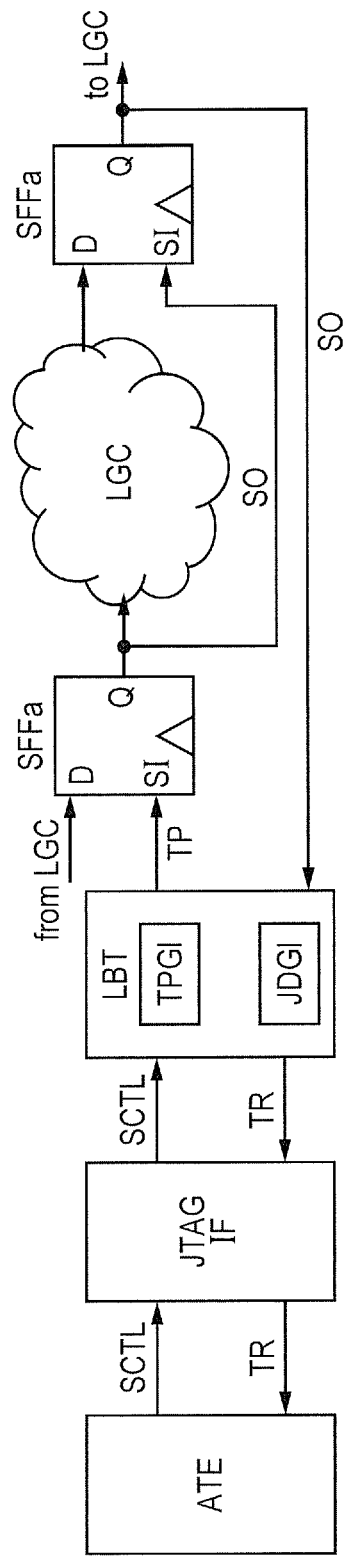
FIG. 13A is a diagram illustrating the scheme of an LBIST circuit.
Figure 13B:
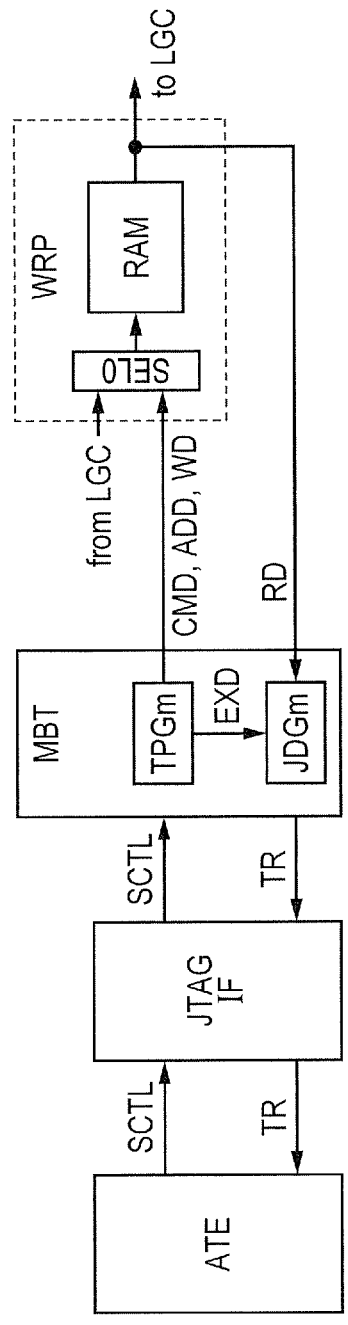
FIG. 13B is a diagram illustrating the scheme of an MBIST circuit.

FIG. 13A is diagram illustrating the scheme of an LBIST circuit, and FIG. 13B is a diagram illustrating the scheme of an MBIST circuit. FIG. 13A illustrates a test device ATE, a JTAG (Joint Test Action Group) interface circuit JTAGIF, an LBIST circuit LBT, a logic circuit LGC, and scan flip flop circuits SFFa and SFFb. The test device ATE may, for example, be a tester for mass production that is coupled to a semiconductor in mass production or any of various information processing devices which can be coupled to a semiconductor device mounted on a wiring board.

The JTAG interface circuit JTAGIF works as a communication interface based on the JTAG standard between the test device ATE and the LBIST circuit LBT. In this case, the JTAG interface circuit JTAGIF transmits various control signals SCTL representing a test execution instruction from the test device ATE to the LBIST circuit LBT, and transmits a test result TR from the LBIST circuit LBT to the test device ATE.

The scan flip flop circuit SFFa and the scan flip flop circuit SFFb are coupled to each other through the logic circuit LGC, further coupled to each other without through the logic circuit LGC with a scan chain. That is, the scan flip flop circuits SFFa and SFFb can selectively latch an input signal D or a scan-in signal SI in accordance with a scan enable signal, and can select either a signal transmission path through the logic circuit LGC or a signal transmission path (a scan chain path) like a shift register through the scan-in signal SI.

The LBIST circuit LBT includes a test pattern generation circuit TPG1 and a result judgment circuit JDG1. The test pattern generation circuit TPG1 generates a test pattern TP using, for example, an LFSR (Linear Feedback Shift Register), in accordance with any of various control signal SCTL, and outputs it as a scan-in signal SI of the scan flip flop circuit (in this case, SFFa) in the first stage of the scan chain. The result judgment circuit JDG1 compresses a scan-out signal SO in the time direction, from the scan flip flop circuit (in this case, SFFb) in the final stage of the scan chain using, for example, a MISR (Multiple Input Signature Register). The result judgment circuit JDG1 compares the compression result with a previously known expected value, to perform quality judgment and generate a test result TR.

The LBIST circuit LBT controls a scan test including a scan-in operation, a capture operation, and a scan-out operation. In the scan-in operation, the LBIST circuit LBT causes the scan flip flop circuits SFFa and SFFb to select a scan-in signal SI side using the scan enable signal, and sets the test pattern TP in series in a scan chain path while sequentially supplying a clock signal. In the capture operation, the LBIST circuit LBT causes the scan flip flop circuits SFFa and SFFb to select an input signal D side using the scan enable signal, and applies a clock signal thereto, thereby causing to perform signal transmission through the logic circuit LGC.

In the scan-out operation, the LBIST circuit LBT causes the scan flip flop circuits SFFa and SFFb to select a scan-in signal SI side using the scan enable signal and output data after the capture operation as a scan-out signal SO in series, while sequentially supplying a clock signal. At the time of this scan-out operation, a scan-in operation is concurrently performed.

FIG. 13B illustrates the test device ATE, the JTAG interface circuit JTAGIF, the MBIST circuit MBT, and a memory circuit RAM wrapped by a wrapper circuit WRP. The test device ATE and the JTAG interface circuit JTAGIF are the same as those of FIG. 13A, except that their communication target is replaced from the LBIST circuit LBT to the MBIST circuit MBT. The wrapper circuit WRP includes a selection circuit SEL0, and works as an interface for test for the memory circuit RAM. In general, the wrapper circuit may include the MBIST circuit MBT. The memory circuit RAM is configured with, for example, a hard macro.

The MBIST circuit MBT includes a test pattern generation circuit TPGm and a result judgment circuit JDGm. The test pattern generation circuit TPGm generates a command signal CMD, an address signal ADD, and write data WD using, for example, a sequencer, in accordance with any of various SCTL, and generates also expected value data EXD. The result judgment circuit JDGm compares read data RD from the memory circuit RAM and the expected value data EXD from the test pattern generation circuit TPGm, to perform quality judgment and generate a test result TR.

The selection circuit SEL0 selects various signals from the logic circuit LGC (that is, a memory pre-stage logic circuit) or various signals from the test pattern generation circuit TPGm, and outputs the selected signals to the memory circuit RAM. The selection circuit SEL0 selects various signals from the test pattern generation circuit TPGm in response to an instruction from a predetermined circuit, when the MBIST circuit MBT performs a test for the memory circuit RAM.

<<Configuration of Semiconductor Device (Comparative Example)>>

Figure 14:
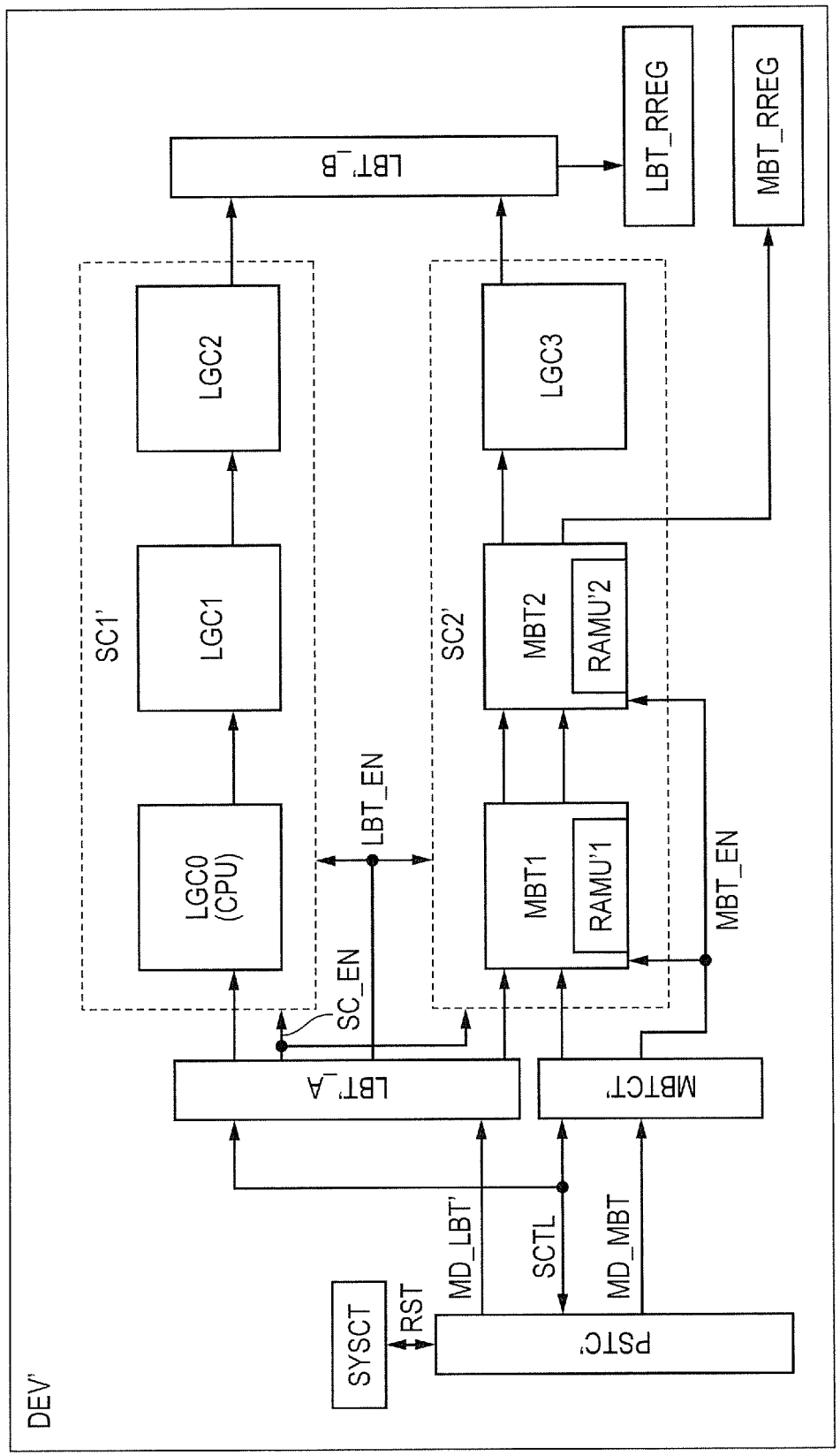
FIG. 14 is a schematic diagram illustrating a configuration example of the main part of a semiconductor device as a comparative example of the present invention.
Figure 15:
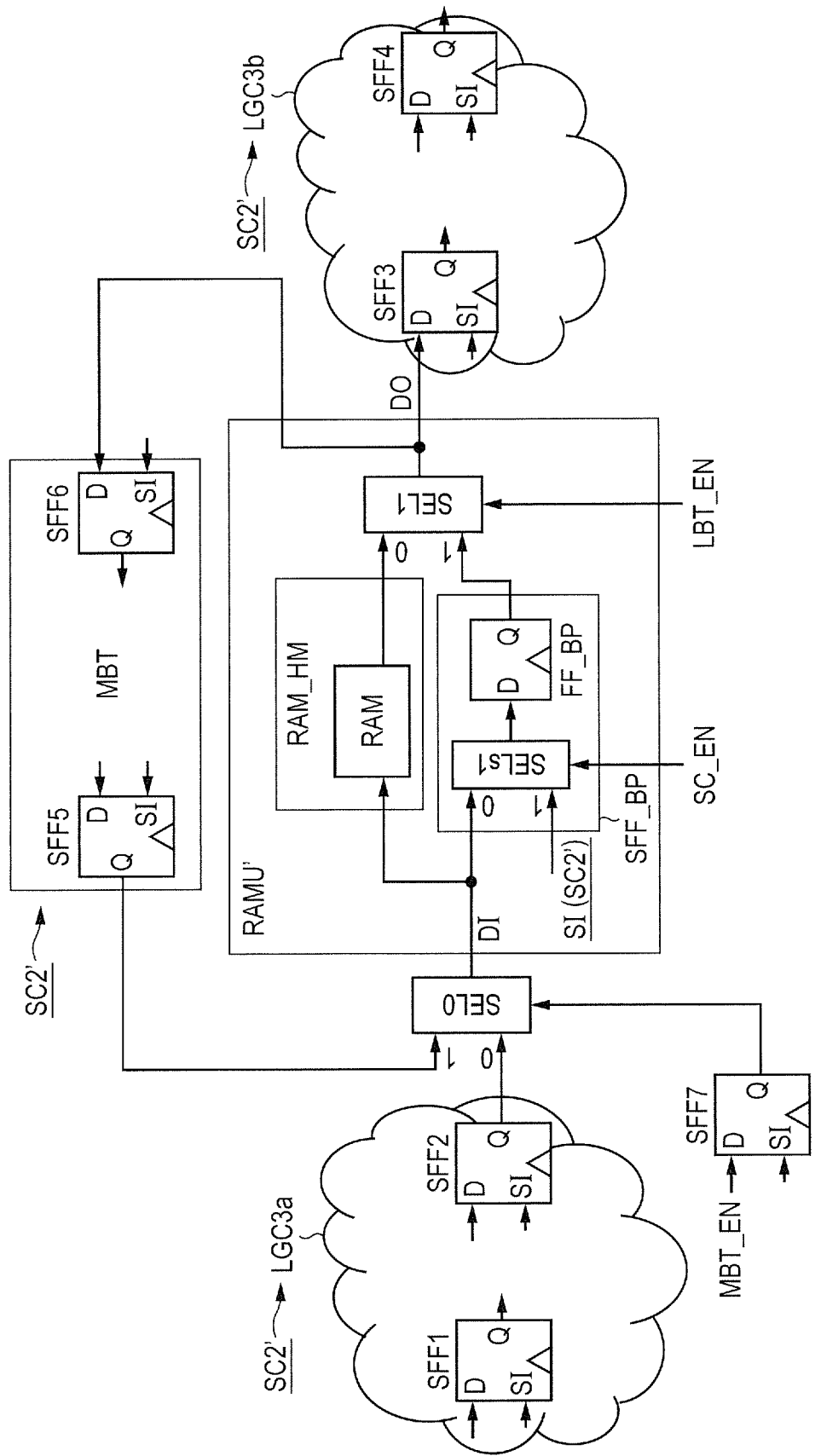
FIG. 15 is a circuit diagram illustrating a schematic configuration example around a memory circuit unit in FIG. 14.

Prior to descriptions of the semiconductor device according to the embodiment, descriptions will now be made to a semiconductor device as a comparative example. FIG. 14 is a schematic diagram illustrating a configuration example of the main part of the semiconductor device as a comparative example of the present invention. FIG. 15 is a circuit diagram illustrating a schematic configuration example around the memory circuit unit in FIG. 14. A semiconductor device DEV' illustrated in FIG. 14 is a micro controller configured with, for example, one semiconductor chip, and is mounted on an ECU (Electronic Control Unit) of automobiles.

This semiconductor device DEV' includes a system control circuit SYSCT, a POST (Power On Self Test) circuit PSTC', LBIST circuits LBT'_A and LBT'_B, an MBIST control circuit MBTCT', a result storage register LBT_RREG for LBIST, and a result storage register MBT_RREG for MBIST. The semiconductor device DEV' includes, as target circuits to be tested, logic circuits LGC0 to LGC3, MBIST circuits MBT1 and MBT2, and memory circuit units RAMU'1 and RAMU'2.

The system control circuit SYSCT manages the entire condition (state) of the semiconductor device DEV', detects power supply of the semiconductor device DEV' as its one function, and asserts a power-on reset signal RST. The POST circuit PSTC' appropriately asserts an LBIST mode signal MD_LBT' and an MBIST mode signal MD_MBT, in response to assertion of the power-on reset signal RST, and issues a start instruction of the LBIST and the MBIST to the LBIST circuit LBT'_A and the MBIST control circuit MBTCT', with the corresponding mode signals. At this time, the POST circuit PSTC' informs the circuits of various setting information necessary for the LBIST or MBIST, using a control signal SCTL.

The LBIST circuits LBT'_A and LBT'_B correspond to the LBIST circuit LBT of FIG. 13A. The LBIST circuit LBT'_A includes the test pattern generation circuit TPG1 of FIG. 13A. The LBIST circuit LBT'_A is set to an LBIST mode, in response to assertion of the LBIST mode signal MD_LBT'. When the LBIST circuit LBT'_A is set to the LBIST mode, it asserts an LBIST enable signal LBT_EN, and executes a scan test (that is, the LBIST) for each scan chain as a target, while controlling a scan enable signal SC_EN. The LBIST circuit LBT'_B includes, for example, the result judgment circuit JDG1 of FIG. 13A, performs compression or quality judgment for the test result, and stores this quality judgment result in the result storage register LBT_RREG for LBIST.

Each of the MBIST circuits MBT1 and MBT2 includes an MBIST control circuit MBTCT', and correspond to the MBIST circuit MBT of FIG. 13B. The MBIST control circuit MBTCT' is set to the MBIST mode in response to assertion of the MBIST mode signal MD_MBT, and asserts the MBIST enable signal MBT_EN, when it is set to the MBIST mode. The MBIST control circuit MBTCT' performs various initial settings prior to the MBIST, for the MBIST circuits MBT1 and MBT2.

Each of the MBIST circuits MBT1 and MBT2 includes, for example, the test pattern generation circuit TPGm and the result judgment circuit JDGm illustrated in FIG. 13B. The MBIST circuit MBT1 tests the memory circuit (the RAM of FIG. 15) in the memory circuit unit RAMU'1, in response to assertion of the MBIST enable signal MBT_EN, and stores this test result (a quality judgment result) in the result storage register MBT_RREG for MBIST. Similarly, the MBIST circuit MBT2 also tests the memory circuit (RAM) in the memory circuit unit RAMU'2, in response to assertion of the MBIST enable signal MBT_EN, and stores this test result in the result storage register MBT_RREG for MBIST.

Each of the logic circuits LGC0 to LGC3 performs a predetermined logical operation. In this case, the logic circuit LGC0 is a CPU (Central Processing Unit). In the example of FIG. 14, the logic circuits LGC0 to LGC2 are incorporated in a scan chain SC1', and the MIST circuits MBT1 and MBT2 and the logic circuit LGC3 are incorporated in a scan chain SC2'. For convenience sake, two scan chains SC1' and SC2' are provided. However, actually, in many cases, more scan chains are provided. That is, many scan chains are provided for the entire logic circuits (the logic circuits LGC0 to LGC3 and any other non-illustrative logic circuits). At least a part of the logic circuits are incorporated in the scan chain SC1'.

When the LBIST circuits LBT'_A and LBT' B are set to the LBIST mode, they simultaneously execute a scan test for the scan chain SC1' and a scan test for the scan chain SC2'. At this time, the MBIST circuits MBT1 and MBT2 are also logic circuits, and thus are targets to be scan-tested (that is, LBIST).

As illustrated in FIG. 15, the memory circuit unit RAMU' includes a scan flip flop circuit SFF_B for bypass as an interface for test and a selection circuit SEL1, in addition to the memory circuit RAM. The memory circuit RAM is a volatile memory, for example, an SRAM (Static Random Access Memory) or a DRAM (Dynamic Random Access Memory). Though no details are given, the memory circuit RAM includes a memory array formed of a plurality of memory cells arranged in an array and various peripheral circuits selecting a memory cell to be accessed. In many cases, the memory circuit RAM built in the micro controller is configured with a hard macro RAM_HM.

The selection circuit SEL1 selects an output signal of the memory circuit RAM or an output signal of the scan flip flop circuit SFF_BP for bypass, in accordance with the LBIST enable signal LBT_EN, and outputs the selected signal as an output signal DO. The scan flip flop circuit SFF_BP for bypass works as a function for bypassing the input/output of the memory circuit RAM, and selectively latches an input signal DI for the memory circuit RAM or a scan-in signal SI. Specifically, the scan flip flop circuit SFF_BP for bypass includes a selection circuit SELs1 for scan which selects the input signal DI or the scan-in signal SI in accordance with the scan enable signal SC_EN and a scan flip flop circuit FF_BP which latches an output signal therefrom. Other scan flip flop circuits (SFF1 of FIG. 15) have the same configuration.

Around the memory circuit unit RAMU', the selection circuit SEL0, logic circuits LGC3*a* and LGC3*b*, and an MBIST circuit MBT are provided. The logic circuits LGC3*a* and LGC3*b* are included in the logic circuit LGC3 of FIG.

14. The logic circuit LGC3*a* includes a plurality of scan flip flop circuits SFF1 and SFF2, and corresponds to the memory pre-stage logic circuit which issues an access instruction to the memory circuit RAM. The logic circuit LGC3*b* includes a plurality of scan slip flop circuits SFF3 and SFF4, and corresponds to a memory post-stage logic circuit to which read data from the memory circuit RAM is input. The MBIST circuit MBT also includes a plurality of scan flip flop circuits SFF5 and SFF6.

The selection circuit SEL0 is one interface for test, selects a signal from the logic circuit (the memory pre-stage logic circuit) LGC3*a* or a signal from the MBIST circuit MBT, and outputs the selected signal to the memory circuit RAM and the scan flip flop circuit SFF_BP for bypass. The selection of the selection circuit SEL0 is performed by a scan flip flop circuit SFF7 which latches the MBIST enable signal MBT_EN. The output signal DO from the memory circuit unit RAMU' is transmitted to the MBIST circuit MBT and the logic circuit (the memory post-stage logic circuit) LGC3*b*.

<<Operation and Problem of Semiconductor Device (Comparative Example)>>

In the semiconductor device DEV', the POST circuit PSTC' asserts the LBIST mode signal MD_LBT'. In accordance with this, the LbIST circuits LBT'_A and LBT'_B concurrently execute scan tests for the scan chains SC1' and SC2' as targets. After this, when the LBIST is completed by the LBIST circuits LBT'_A and LBT'_B, the POST circuit PSTC' asserts the MBIST mode signal MD_MBT. In accordance with this, the MBT circuits MBT1 and MBT2 test the memory circuits RAM of the respective memory circuit units RAMU'1 and RAMU'2. In this manner, the LBIST and the MBIST are executed in series.

Figure 16:
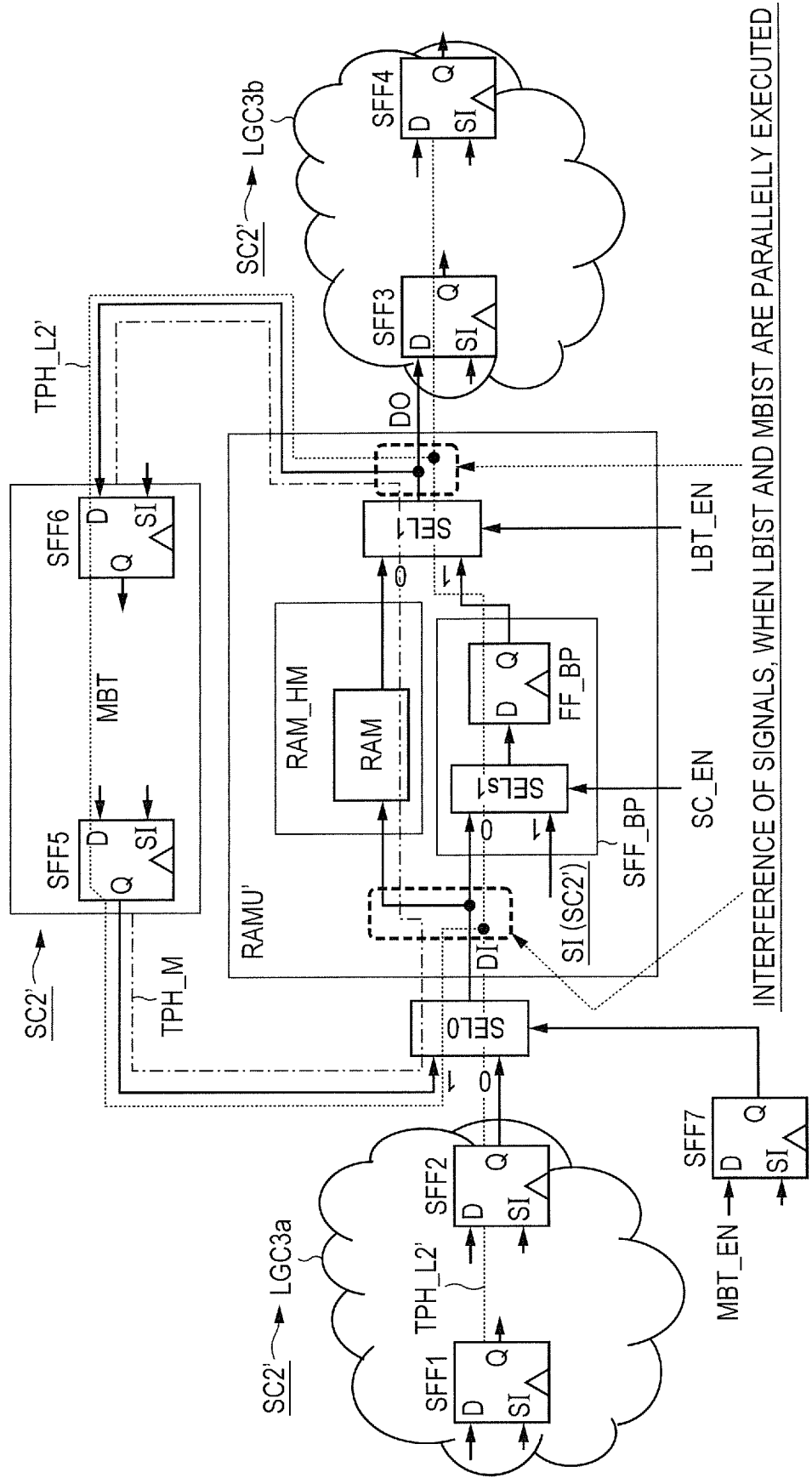
FIG. 16 is a diagram illustrating an operation example around the memory circuit unit of FIG. 15.

FIG. 16 is a diagram illustrating an operation example around the memory circuit unit of FIG. 15. As illustrated in FIG. 16, the scan flip flop circuits SFF1 to SFF6 and a scan flip flop circuit SFF_BP for bypass are coupled in an arbitrary order, as the scan chain SC2'. In the scan test for the scan chain SC2', the selection circuit SEL1 is fixed to the side of "1" in response to assertion of the LBIST enable signal LBT_EN, and a signal transmission path TPH_L2' of FIG. 16 is tested in a capture operation. That is, a test is performed for a path from the logic circuit LGC3*a* to the logic circuit LGC3*b* through the scan flip flop circuit SFF_BP for bypass and a path from the MBIST circuit MBIST circuit MBT to the MBIST circuit MBT through the scan flip flop circuit SFF_BP for bypass.

At this time, for example, the scan flip flop circuit SFF7 is also incorporated in the scan chain SC2', thereby enabling to test both input paths, while appropriately switching the input path from the MBIST circuit MBT toward the scan flip flop circuit SFF_BP for bypass and the input path from the logic circuit LGC3*a*. The scan flip flop circuit SFF_BP for bypass is provided for testing both of the input paths and for preventing the values of the scan flip flop circuits SFF3 and SFF6 from being undefined values. If the scan flip flop circuit SFF_BP is not provided, the output signal DO in the capture operation will be an output signal (that is, an undefined value) of the memory circuit RAM. It is difficult to perform the scan test (LBIST), if an undefined value exists.

In this manner, if the test of the signal transmission path TPH_L2' is completed, the selection circuit SEL0 selects the side of the MBIST circuit MBT in response to assertion of the MBIST enable signal MBT_EN, and the selection circuit SEL1 selects the side of the memory circuit RAM in accordance with negate of the LBIST enable signal LBT_EN. In this state, the MBIST circuit MBT tests the memory circuit RAM through a signal transmission path TPH_M of FIG. 16.

As described above, in FIG. 15 and FIG. 16, in the scan chain SC2', the MBIST circuit MBT, the logic circuit (the memory pre-stage logic circuit) LGC3*a*, and the logic circuit (the memory post-stage logic circuit) LGC3*b* are incorporated. Thus, the first problem is that a long period of time is required for the self-test. Specifically, a long period of time is required for executing the scan test for the scan chain SC2' by the LBIST circuits LBT'_A and LBT' B, thus requiring a long period of time for the self-test. Further, because the MBIST circuit MBT is a target to be scan-tested, the test for the memory circuit RAM cannot be executed, if this scan test has not completed yet. Thus, the LBIST and the MBIST are executed in series, and it takes a further long time for the self-test.

The present inventors have examined that, for example, the logic circuits LGC3*a* and LGC3*b* are transited from the scan chain SC2' to another scan chain. Then, it is possible to reduce the time for executing the scan test for the scan chain SC2'. After this, the MBIST may possibly be performed concurrently with the scan test for another scan chain. However, in this case, the second problem is that it may be difficult to concurrently execute the MBIST and the LBIST, as a result that the MBIST and the LBIST interfere with each other.

Specifically, in FIG. 16, the output signal DO in the execution period of the MBIST is determined by the memory circuit RAM. As a result, if the scan test for another scan chain is concurrently executed, an undefined value is input to the scan flip flop circuit SFF3 in the pre-stage of the logical circuit LGC3*b*, at the time of the capture operation. In this manner, as a result that the MBIST and the LBIST interfere with each other, in FIG. 16, it is difficult to separate the logic circuit LGC3*b* from the scan chain SC2'. It is also difficult to execute the scan test (LBIST) using the scan flip flop circuit SFF_BP for bypass, concurrently with the MBSIT. That is, in this case, in the scan flip flop circuit SFF_BP for bypass, in the capture operation, because an output signal can be input from the MBIST circuit MBT, an undefined value is input in a viewpoint of the scan test.

<<Configuration of Semiconductor Device (First Embodiment)>>

FIG. 1 is a schematic diagram illustrating a configuration example of the main part of a semiconductor device according to the first embodiment of the present invention. In the semiconductor device illustrated in FIG. 1, input/output signals of the POST circuit PSTC, the LBIST circuits LBT_A and LBT_B, and the MBIST control circuit MBTCT are slightly different from those of the semiconductor device DEV' illustrated in FIG. 14, and the configurations of the memory circuit unit RAMU1 and RAMU2 are different therefrom. Further, unlike the semiconductor device DEV' illustrated in FIG. 14, in the semiconductor device DEV illustrated in FIG. 1, the logic circuit LGC3 is incorporated in the scan chain SC1 instead of the scan chain SC2. Descriptions will hereinafter be made to the semiconductor device, by focusing on differences from FIG. 14.

The POST circuit PSTC generates an LBIST/MBIST simultaneous test mode (abbreviated to "simultaneous test mode") signal MD_LM, in addition to the LBIST mode signal MD_LBT and the MBIST mode signal MD_MBT. The LBIST circuits LBT_A and LBT_B are set to an LBIST mode, in response to assertion of the LBIST mode signal MD_LBT. When the LBIST circuit LBT_A is set to this LBIST mode, it asserts LBIST enable signals LBT_EN1 and LBT_EN2, and concurrently executes a scan test for the scan chain SC1 as a target and a scan test for the scan chain SC2 as a target. That is, the LBIST circuit LBT_A executes the LBIST for the scan chain SC1 while controlling the scan enable signal SC_EN1, and concurrently executes the LBIST for the scan chain SC2 while controlling the scan enable signal SC_EN2.

The LBIST circuits LBT_A and LBT_B are set to the simultaneous test mode, in response to assertion of the simultaneous test mode signal MD_LM. When the LBIST circuit LBT_A is set to the simultaneous test mode, it asserts the LBIST enable signal LBT_EN1, and executes the scan test for the scan chain SC1 as a target while controlling the scan enable signal SC_EN1.

That is, when the LBIST circuit LBT_A is set to the simultaneous test mode, it does not execute the scan test for the scan chain SC2 as a target. The configuration and the operation of the LBIST circuit LBT_B are substantially the same as those of the LBIST circuit LBT' B of FIG. 14. When the LBIST circuit LBT_B is set to the LBIST mode, it operates in response to a scan-out signal from the scan chains SC1 and SC2. When it is set to the simultaneous test mode, it operates in response to a scan-out signal only from the scan chain SC1.

The MBIST control circuit MBTCT is set to the simultaneous test mode in response to assertion of the simultaneous test mode signal MD_LM. When it is set to the simultaneous test mode, it asserts the MBIST enable signal MBT_EN. Like the case of FIG. 14, the MBIST circuits MBT1 and MBT2 test the memory circuit (for example, the RAM of FIG. 5, as will be described later) in the memory circuit units RAMU1 and RAMU2, in response to assertion of the MBIST enable signal MBT_EN. Like the case of FIG. 14, the MBIST mode signal MD_MBT from the POST circuit PSTC is used when it is intended to execute only the MBIST, instead of the simultaneous execution of the LBIST and the MBIST. In the first embodiment, it is possible to exclude the MBIST mode signal MD_MBT.

Unlike the case of FIG. 14, as will specifically be described later, in the memory circuit units RAMU1 and RAMU2, a part of the circuits (specifically, the scan flip flop circuit for bypass) is incorporated in the scan chain SC1. Thus, to the memory circuit units RAMU1 and RAMU 2, an LBIST enable signal LBT_EN1, a scan enable signal SC_EN1, and an MBIST enable signal MBT_EN are input. To the MBIST circuits MBT1 and MBT2, an LBIST enable signal LBT_EN2, a scan enable signal SC_EN2, and an MBIST enable signal MBT_EN are input.

<<Entire Operation of Semiconductor Device (First Embodiment)>>

Figure 2:
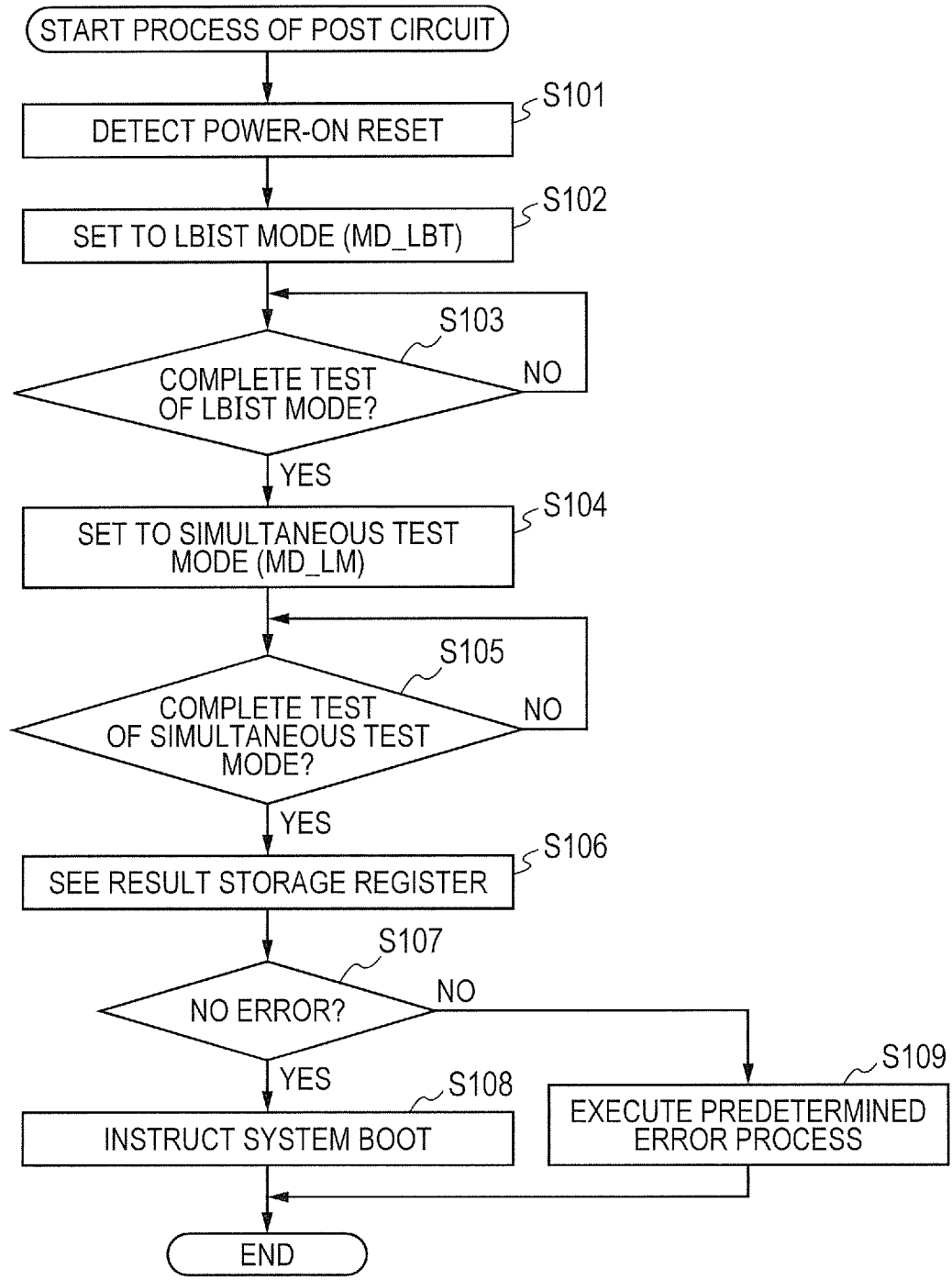
FIG. 2 is a flow diagram illustrating a schematic operation example of a POST circuit in FIG. 1.
Figure 3:
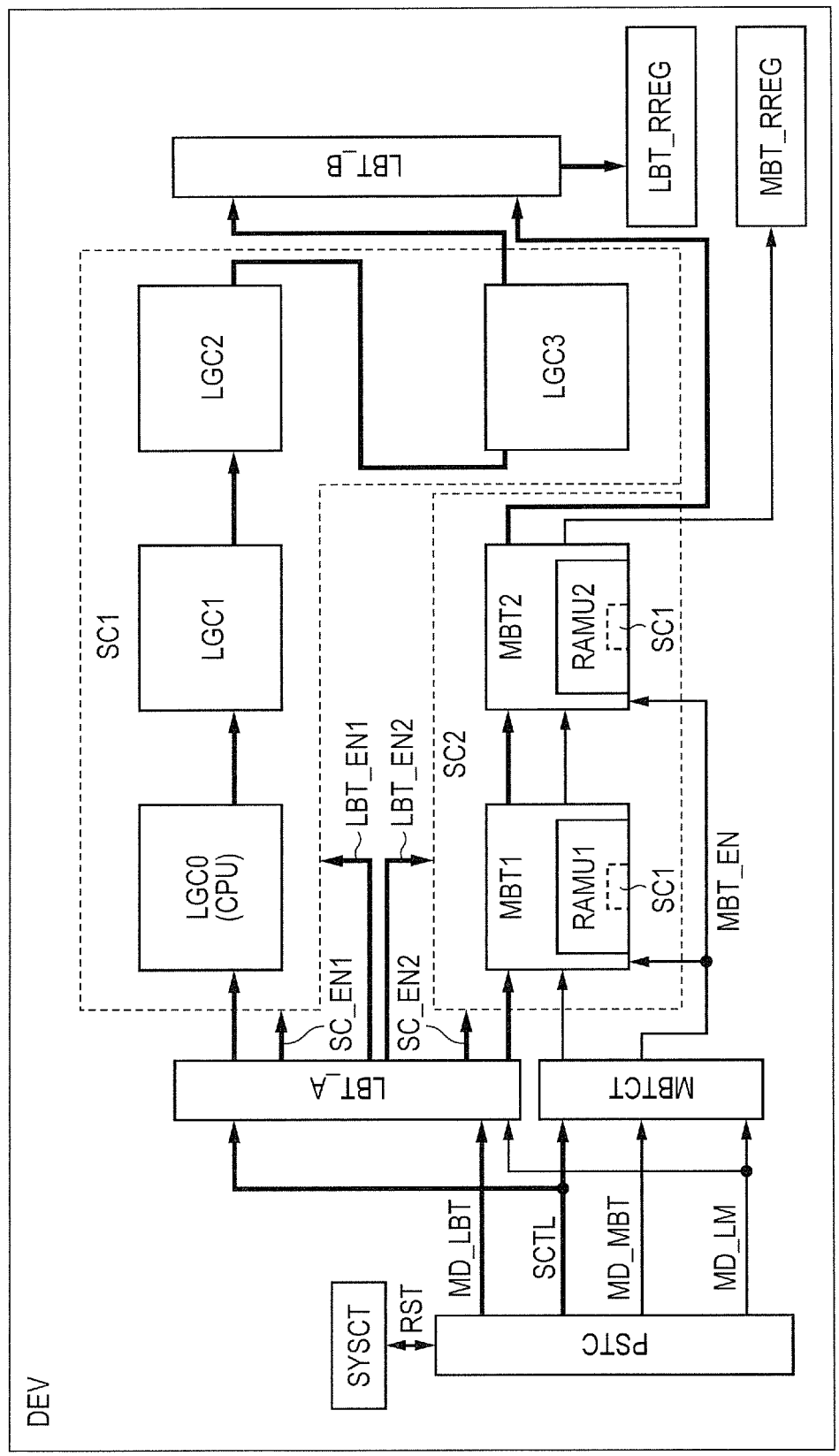
FIG. 3 is an explanatory diagram illustrating a schematic operation example in an LBIST test mode of FIG. 2, in the semiconductor device of FIG. 1.
Figure 4:
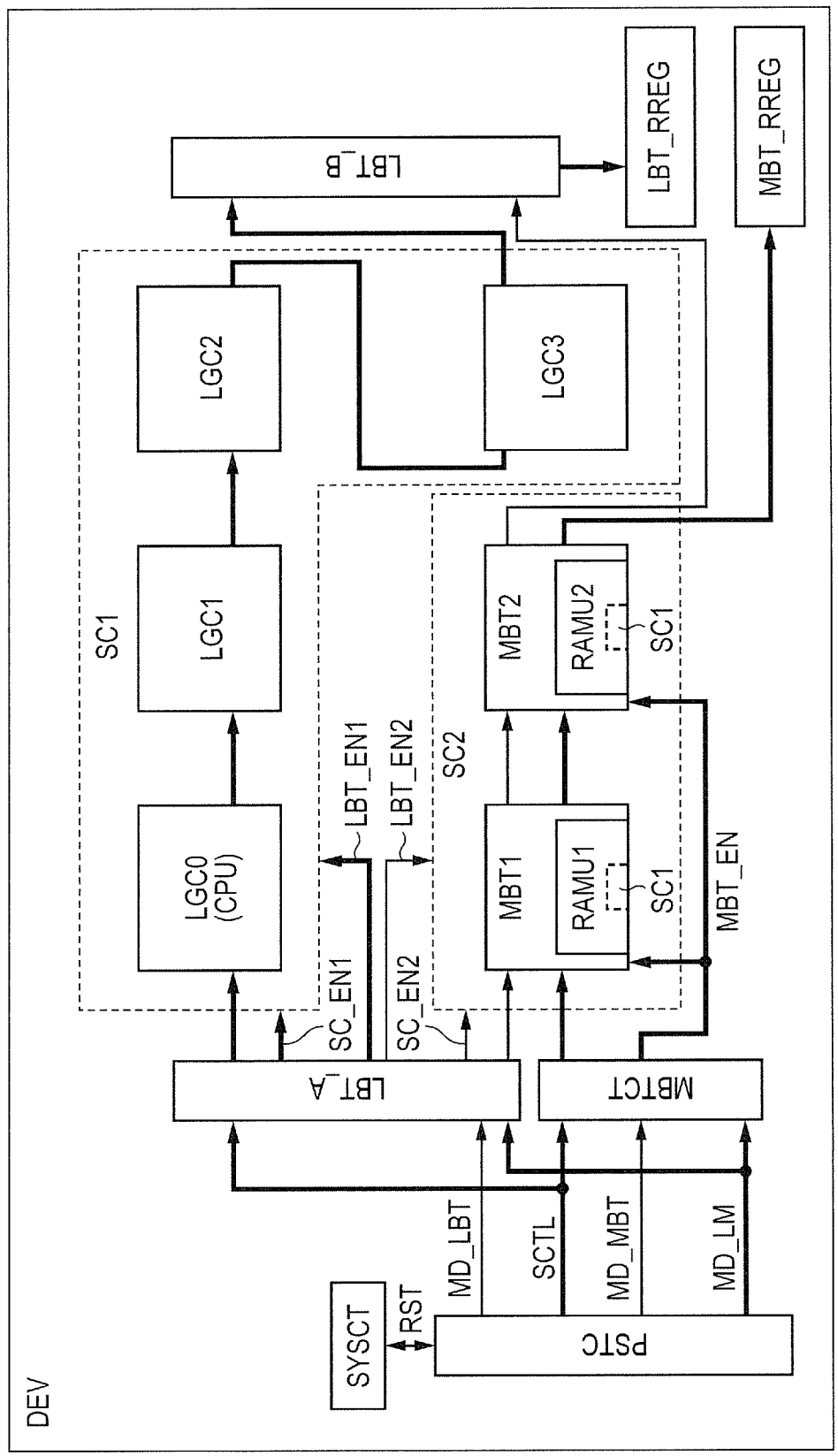
FIG. 4 is an explanatory diagram illustrating a schematic operation example in a simultaneous test mode of FIG. 2, in the semiconductor device of FIG. 1.

FIG. 2 is a flow diagram illustrating a schematic operation example of the POST circuit in FIG. 1. FIG. 3 is an explanatory diagram illustrating a schematic operation example at the time of the LBIST mode of FIG. 2, in the semiconductor device of FIG. 1. FIG. 4 is an explanatory diagram illustrating a schematic operation example at the time of the simultaneous test mode of FIG. 2, in the semiconductor device of FIG. 1. In FIG. 2, the POST circuit PSTC first receives a power-on reset signal RST from the system control circuit SYSCT (Step S101). In response to reception of the power-on reset signal RST (in other words, in response to power supply of the semiconductor device DEV), the POST circuit PSTC asserts the LBIST mode signal MD_LBT, thereby setting the LBIST circuits LBT_A and LBT_B into an LBIST mode (Step S102).

Then, as illustrated by a thick line of FIG. 3, the LBIST circuits LBT_A and LBT_B assert the LBIST enable signals LBT_EN1 and LBT_EN2, and concurrently execute the scan chains SC1 and SC2 while controlling the scan enable signals SC_EN1 and SC_EN2. At this time, the circuits of the scan chain SC1 in the memory circuit units RAMU1 and RAMU2 are included in the target to be tested in the scan chain SC1.

Back to FIG. 2, the POST circuit PSTC judges whether the test of the LBIST has completed (Step S103). The circuits (in this case, MBT1 and MBT2) incorporated in the scan chain SC2 are sufficiently smaller than those circuits (in this case, LGC0 to LGC3) incorporated in the scan chain SC1. Thus, the time for executing the scan test for the scan chain SC1 as a target is longer than the time for executing the scan test for the scan chain SC2 as a target.

Specifically, the number of test patterns required for the scan test for the scan chain SC1 is sufficiently greater than the number of test patterns required for the scan test for the scan chain SC2. The test of the LBIST mode is completed at a stage where the scan test for this scan chain SC2 is completed. That is, the test of the LBIST mode is completed at a stage where the test patterns required for the scan test of the scan chain SC2 are entirely tested, and that there still remains a test pattern required for the scan test of the scan chain SC1. From this viewpoint, the LBIST mode signal MD_LBT in FIG. 1 is slightly different from the LBIST mode signal MD_LBT' in FIG. 14.

The POST circuit PSTC performs judgment of, for example, Step S103 in accordance with whether test completion notification of the LBIST mode has been received from the LBIST circuit LBT_A. When it is judged that it is completed in Step S103, the POST circuit PSTC asserts the simultaneous test mode signal MD_LM, thereby setting the LBIST circuits LBT_A and LBT_B and the MBIST circuits MBT1 and MBT2 into a simultaneous test mode (Step S104).

Then, as illustrated by a thick line of FIG. 4, the LBIST circuit LBT_A asserts the LBIST enable signal LBT_EN1, and executes the scan test for the scan chain SC1 while controlling the scan enable signal SC_EN1. That is, the LBIST circuits LBT_A and LBT_B continuously execute the scan test for the scan chain SC1 using the test pattern left in the test of the above-described LBIST mode. At this time, the circuits of the scan chain SC1 in the memory circuit units RAMU1 and RAMU2 are included in the target to be tested in the scan chain SC1.

As illustrated by a thick line of FIG. 4, the MBIST control circuit MBTCT asserts the MBIST enable signal MBT_EN, in response to assertion of the simultaneous test mode signal MD_LM. In accordance with this, the MBIST control circuits MBT1 and MBT2 test the respective memory circuits of the memory circuit units RAMU1 and RAMU2, concurrently with the scan test for the scan chain SC1 by the LBIST circuits LBT_A and LBT_B.

After this, the POST circuit PSTC judges whether the test of the simultaneous test mode has been completed, in accordance with whether test completion notification of the simultaneous test mode has been received from, for example, the LBIST circuit LBT_A and the MBIST circuits MBT1 and MBT2 (Step S105). When it is judged that the test has been completed in Step S105, the POST circuit PSTC refers to the result storage register LBT_RREG for LBIST and the result storage register MBT_RREG for MBIST (Step S106). As a result of the reference to the registers, when it is judged that there is no error, the POST circuit PSTC instructs the system control circuit SYSCT to boot the system, and when it is judged that there is an error, it performs a predetermined error process (Step S107 to S109).

As described above, by providing the simultaneous test mode, the above-described first problem can be solved, and it is possible to reduce the time required for the self-test. That is, except a period of time for executing only the MBIST, the time for executing the MBIST can be incorporated in the time for executing the LBIST. In FIG. 2, it is possible to switch those procedures of Step S102 and Step S103 and the procedures of Step S104 and Step S105. That is, the test in the LBIST mode may be performed after the test in the simultaneous test mode has been performed beforehand.

In FIG. 2, because error judgment is performed in Step S107, the test in the simultaneous test mode has been performed regardless of whether there is an error in the scan test for the scan chain SC2 (that is, the MBIST circuits MBT1 and MBT2). However, in some case, when there is an error in the scan test for the scan chain SC2, it is possible to use the flow without performing the MBIST.

<<Configuration and Operation Around Memory Circuit Unit>>

Figure 5:
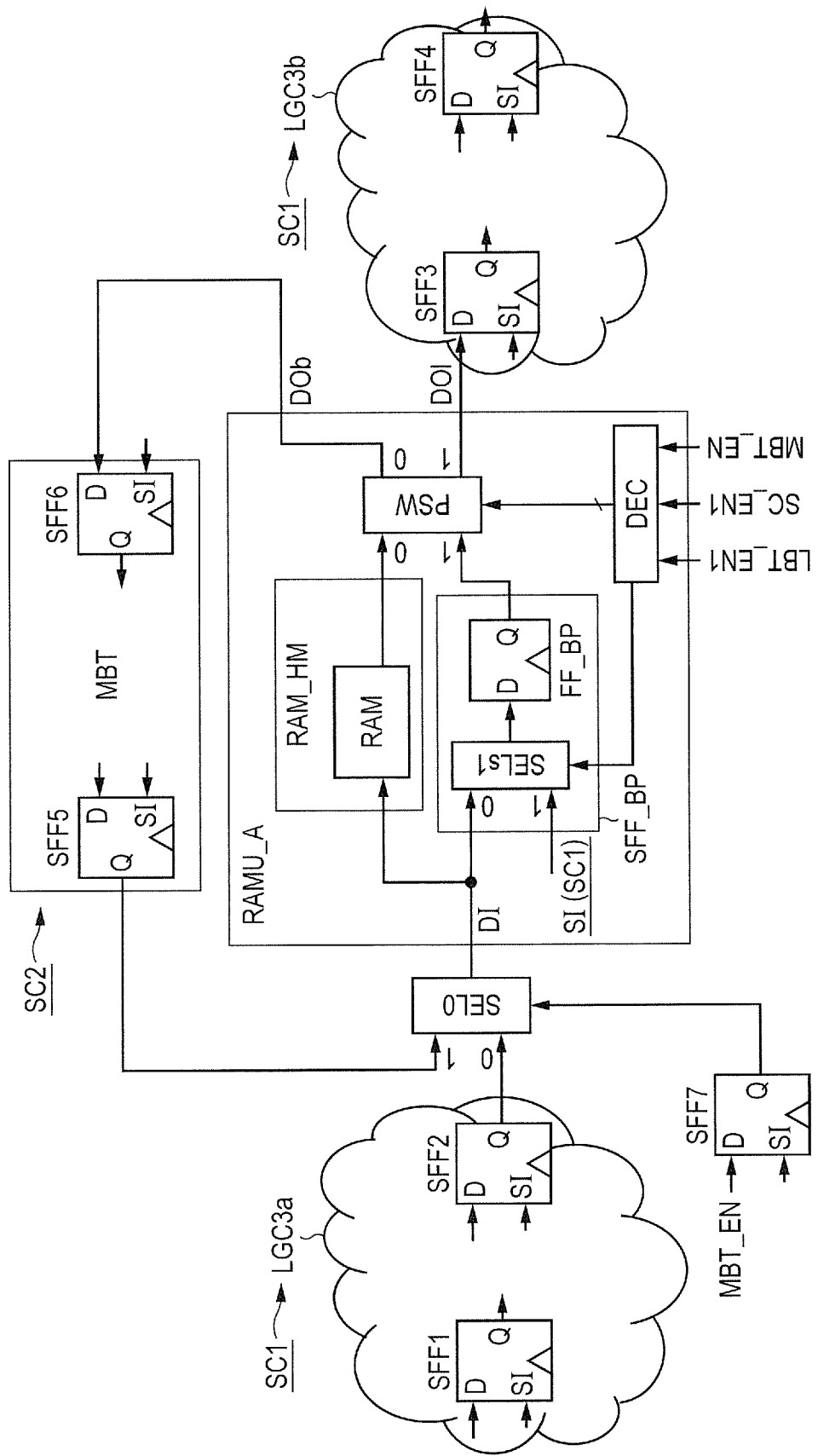
FIG. 5 is a circuit diagram illustrating a schematic configuration example around a memory circuit unit in FIG. 1.

FIG. 5 is a circuit diagram illustrating a schematic configuration example around the memory circuit unit in FIG. 1. Descriptions will be focused on differences from the configuration example of FIG. 15. The memory circuit unit RAMU_A illustrated in FIG. 5 includes the memory circuit RAM and the scan flip flop circuit SFF_BP for bypass, like the case of FIG. 15. However, unlike the case of FIG. 15, the scan-in signal SI of the scan flip flop circuit SFF_BP for bypass is an output signal of the scan flip flop circuit of any of the logic circuits LGC0 to LGC3 incorporated in the scan chain SC1. That is, the scan flip flop circuit SFF_BP for bypass is incorporated in the scan chain SC1.

The memory circuit unit RAMU_A includes a decoder DEC and a path switch circuit PSW. In response to the LBIST enable signal LBT_EN1, the scan enable signal SC_EN1, and the MBIST enable signal MBT_EN, the decoder DEC controls the selection circuit SELs1 for scan in the scan flip flop circuit SFF_BP for bypass, and controls an input/output path of the path switch circuit PSW.

As will specifically be described, the path switch circuit PSW transmits an output signal of the scan slip flop circuit SFF_BP for bypass to the MBIST circuit MBT and the logic circuit (memory post-stage logic circuit) LGC3b, when it is set into the LBIST mode. At this time, an output signal DOb is transmitted to the MBIST circuit MBT, and an output signal DO1 as the same as the output signal DOb is transmitted to the logic circuit LGC3b. When it is set into the simultaneous test mode, the path switch circuit PSW transmits the output signal of the scan flip flop circuit SFF_BP for bypass to the logic circuit LGC3b, and transmits the output signal of the memory circuit RAM to the MBIST circuit MBT. At this time, the output signal DOb is transmitted to the MBIST circuit MBT, and the output signal DO1 different from the output signal DOb is transmitted to the logic circuit LGC3b.

In FIG. 5, unlike the case of FIG. 15, the logic circuit (memory pre-stage logic circuit) LGC3a issuing an instruction for accessing to the memory circuit RAM and the logic circuit (memory post-stage logic circuit) LGC3b to which read data is input from the memory circuit RAM are incorporated in the scan chain SC1. Like the case of FIG. 15, the MBIST circuit MBT is incorporated in the scan chain SC2.

Figure 6A:
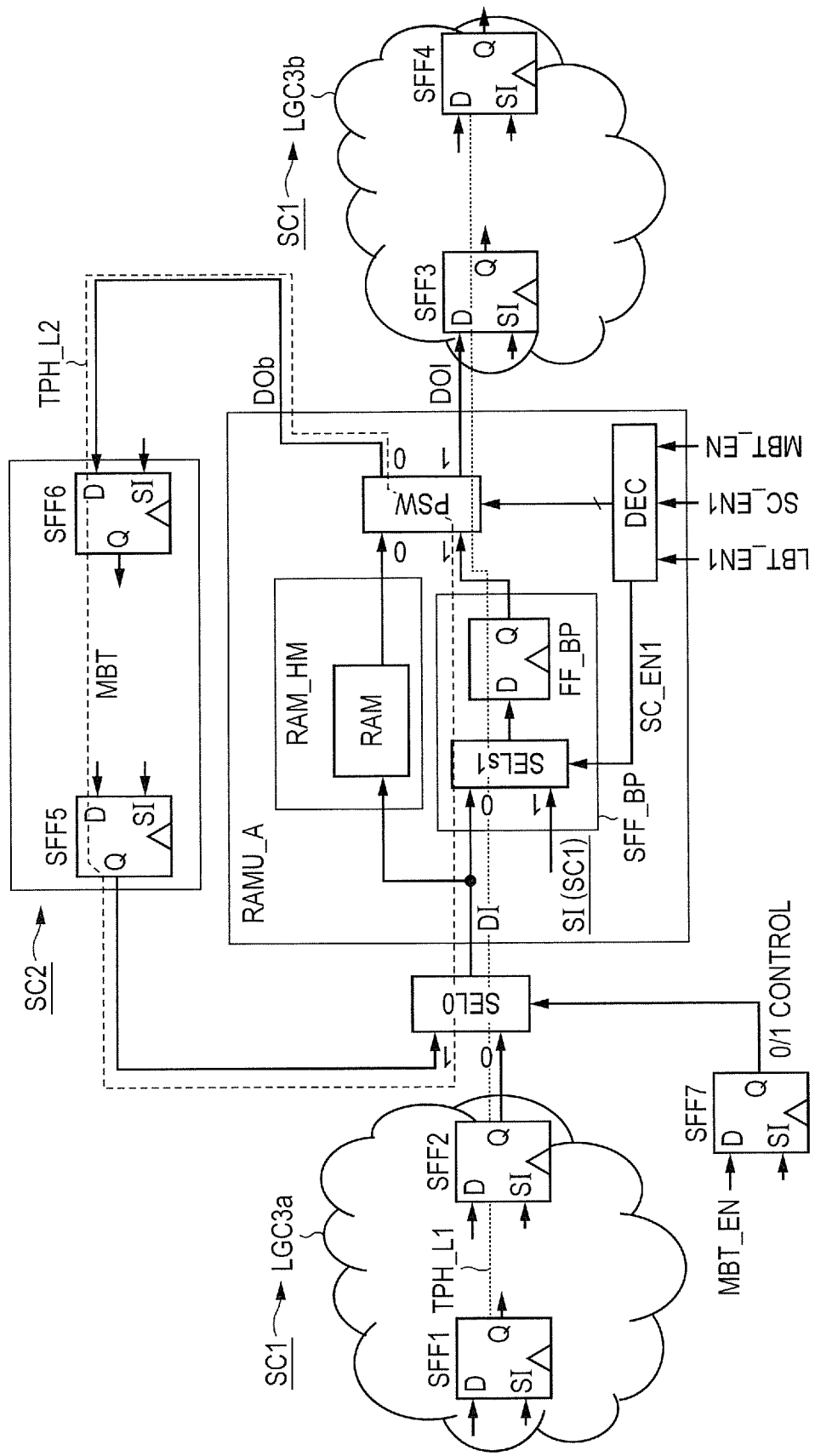
FIG. 6A is a diagram illustrating an operation example in the LBIST mode around the memory circuit unit of FIG. 5.

FIG. 6A is a diagram illustrating an operation example in the LBIST mode, around the memory circuit unit of FIG. 5. In FIG. 6A, the scan flip flop circuits SFF1 to SFF4 in the logic circuits LGC3a and LGC3b, the scan flip flop circuits SFF_BP for bypass, and the scan flip flop circuits in the logic circuits LGC0 to LGC2 in FIG. 1 are coupled as the scan chain SC1 in an arbitrary order.

In the scan test for the scan chain SC1 as a target in the LBIST mode, in a capture operation, a signal transmission path TPH_L1 of FIG. 6A is tested. That is, a test is performed for a path from the logic circuit LGC3a to the logic circuit LGC3b through the scan flip flop circuit SFF_BP for bypass. At this time, the selection circuit SELs1 for scan is controlled by the scan enable signal SC_EN1 as usual.

In the scan test for the scan chain SC2 as a target in the LBIST mode, in the capture operation, a signal transmission path TPH_L2 of FIG. 6A is tested. That is, a test is performed for a path from the MBIST circuit MBT to the MBIST circuit MBT through the scan flip flop circuit SFF_BP for bypass. At this time, for example, the scan flip flop circuit SFF7 is incorporated in the scan chain SC2. As a result, while an input path from the MBIST circuit MBT and an input path from the logic circuit LGC3a, toward the scan flip flop circuit SFF_BP for bypass, are appropriately switched, both input paths can be tested.

Note, however, in this case, the scan flip flop circuit SFF_BP for bypass is shared by the scan chain SC1 and the scan chain SC2, unlike the case of FIG. 15. It is assumed that there is synchronization among the scan-in operation of the scan chain SC1 and the scan chain SC2, the capture operation, and the scan-out operation. As a result, for example, at the time of the capture operation, the test pattern of the scan flip flop circuit SFF5 which is set in the scan chain SC2 may be transmitted to the scan flip flop circuit SFF_BP for bypass of the scan chain SC1. The test pattern of the scan flip flop circuit SFF_BP for bypass which is set in the scan chain SC1 may be transmitted to the scan flip flop circuit SFF6 of the scan chain SC2.

In this manner, even when a part of the scan chains SC1 and SC2 is shared, like the case of FIG. 15, in the scan flip flop circuits SFF1 to SFF7 and the scan flip flop circuit SFF_BP for bypass, the test pattern can unambiguously be defined, and an expected value pattern after the capture operation can also unambiguously be defined. Thus, if the test pattern and the expected value pattern are generated in advance on the assumption that a part of the scan chains SC1 and SC2 is shared, it is possible to concurrently execute the scan tests of the scan chains SC1 and SC2.

Figure 6B:
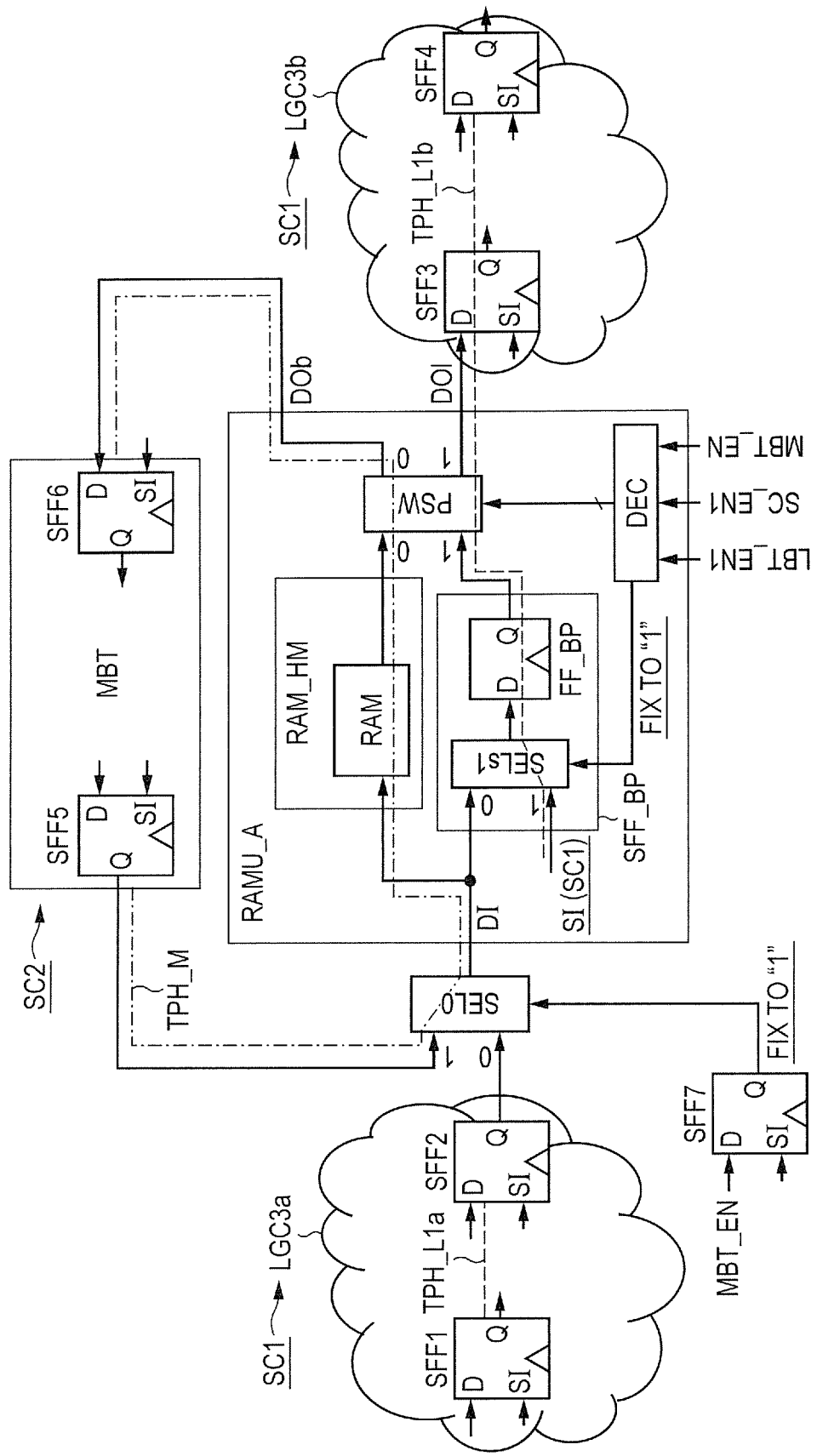
FIG. 6B is a diagram illustrating an operation example in the simultaneous test mode around the memory circuit unit of FIG. 5.

FIG. 6B is a diagram illustrating an operation example at the time of the simultaneous test mode around the memory circuit unit of FIG. 5. In the scan test for the scan chain SC1 as a target at the time of the simultaneous test mode, in the capture operation, a test is performed on signal transmission paths TPH_L1a and TPH_L1b of FIG. 6B. That is, a test is performed on the path in the logic circuit LGC3a and a path from the scan flip flop circuit SFF_BP for bypass of the logic circuit LGC3b. At this time, unlike the usual case, the selection circuit SELs1 for scan is fixed to "1". Then, the scan flip flop circuit SFF_BP for bypass fixedly latches the scan-in signal SI (that is, the output signal of the scan flip flop circuit which is scan-coupled to the pre-stage), at the time of the capture operation in addition to the scan-in operation and the scan-out operation.

At the time of the simultaneous test mode, the MBIST circuit MBT tests the memory circuit RAM through the signal transmission path TPH_M of FIG. 6B. At this time, the selection circuit SEL0 is fixed to "1" in response to assertion of the MBIST enable signal MBT_EN, and transmits a signal from the MBIST circuit MBT to the memory circuit RAM as an input signal DI.

In this case, the selection circuit SELs1 for scan is fixed to "1". Thus, unlike the case of FIG. 16, the scan flip flop circuit SFF_BP for bypass never latches an input signal (that is, an undefined value) at the time of the MBIST from the MBIST circuit MBT. In the simultaneous test mode, unlike the case of the LBIST mode, an input path (in other words, an input path to the memory circuit RAM) from the logic circuit LGC3a (the scan flip flop circuit SFF2) to the scan flip flop circuit SFF_BP for bypass is not a target to be tested. Thus, this input path needs to be tested in the LBIST mode.

In the simultaneous test mode, the path switch circuit PSW transmits an output signal (that is, read data) from the memory circuit RAM to the MBIST circuit MBT as an output signal DOb, and transmits an output signal from the scan flip flop circuit SFF_BP for bypass to the logic circuit LGC3b as an output signal DO1. As a result, unlike the case of FIG. 16, even when the scan flip flop circuit SFF3 in the logic circuit LGC3b concurrently executes the MBIST and the LBIST, it never latches read data (that is, the undefined value) from the memory circuit RAM.

In this manner, as a result that it is possible to solve the problem of interference (that is, the second problem) between the MBIST and the LBIST as described in FIG. 16, it is possible to concurrently execute the MBIST and the LBIST using the scan flip flop circuit SFF_BP for bypass. It is also possible to transit the logic circuits LGC3a and LGIC3b to another scan chain SC1. Then, using the flow of FIG. 2, it is possible to reduce the time required for the self-test.

<<Main Effect of First Embodiment>>

FIG. 7 is a pattern diagram illustrating an example of the effect when the semiconductor device according to the first embodiment of the present invention is used. As illustrated in FIG. 7, when the method of the comparative example illustrated in FIG. 14 to FIG. 16 is used, the time required for the self-test is substantially defined with a total value of a time T1 and a time T2. The time T1 is a longer time, of the times required respectively for the LBISTs of the scan chains SC1' and SC2' with the LBIST mode signal MD_LBT', while the time T2 is required for the MBIST with the MBIST mode signal MD_MBT.

When the method of the first embodiment is used, the time required for the self-test is substantially defined with a total value of a time T3 and a time T4. The time T3 is a shorter time, of the times required respectively for the LBISTs of the scan chains SC1 and SC2 with the LBIST mode signal MD_LBT (that is, the side of the scan chain SC2), while the time T4 is a longer time, of the time required for the remaining LBIST of the scan chain SC1 with the simultaneous test mode signal MD_LM and the time required for the MBIST.

A time T6 is required for performing various initial settings for the MBIST circuits MBT1 and MBT2 with the MBIST. A time T7 is required for performing various initial settings with the MBIST, and for performing various initial settings with a change in the LBIST. For example, in the simultaneous test mode, because the number of scan chains is reduced, it is necessary to change the setting of the LBIST circuit LBT_B.

As illustrated in FIG. 7, ideally, it is possible to design the scan chains SC1 and SC2 in a manner that the total value of the time T3 and the time T4 is equal to the time T1, and that the time T4 is equal to the time T2. As a result, the time required for the self-test may possibly be shorter than that of the comparative example by the time T5 T2). In fact, the total value of the time T3 and the time T4 may slightly be shorter than the time T1. However, if the method of the first embodiment is used, it is possible to reduce the time required for the self-test at least by a time which is not necessary for executing only the MBIST (in other words, a time for concurrently executing the MBIST and the LBIST).

In this manner, as a result that the time required for the self-test can be reduced, it is possible to reduce the activation time of the semiconductor device or an electronic control unit (ECU) on which this semiconductor device is mounted. When the time required for the self-test is defined like the case of the comparative example, it is possible to add a test item in the reduced time T5, thereby attaining high reliability of the semiconductor device. In this case, the scan chain SC2 is configured only with the MBIST circuits MBT1 and MBT2. However, in some case, any other circuit may be included therein. That is, the time for executing the LBIST necessary in the scan chain SC2 may sufficiently be shorter than the time for executing the LBIST necessary in the scan chain SC1. Second Embodiment <<Various Modifications of Memory Circuit Unit>>

Figure 8A:
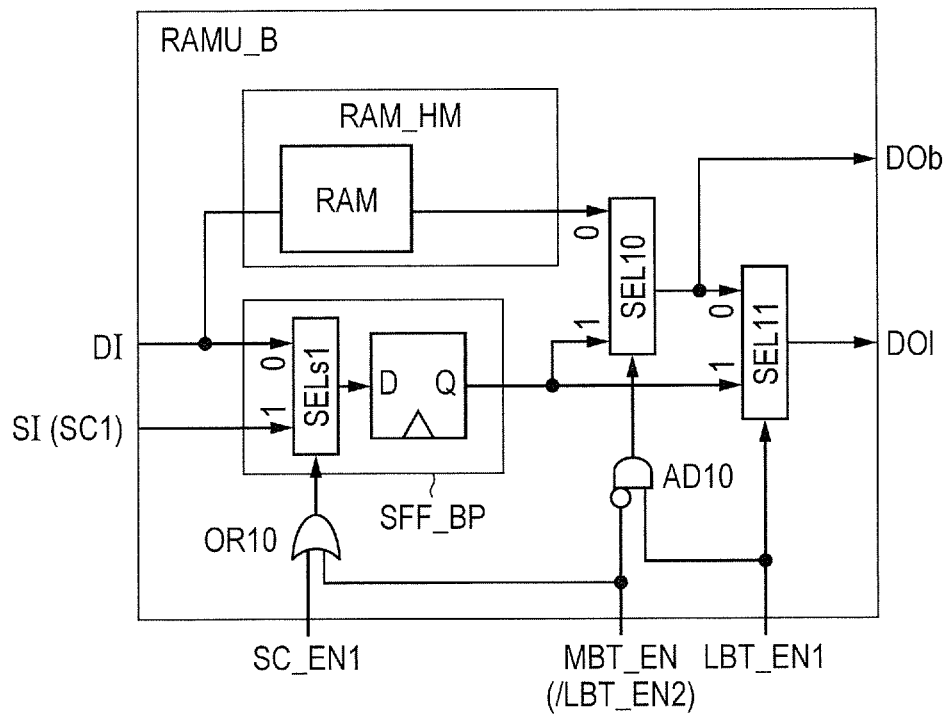
FIG. 8A is a circuit diagram illustrating a schematic configuration example of the memory circuit unit in the semiconductor device of FIG. 1, in a semiconductor device according to the second embodiment of the present invention.
Figure 8B:
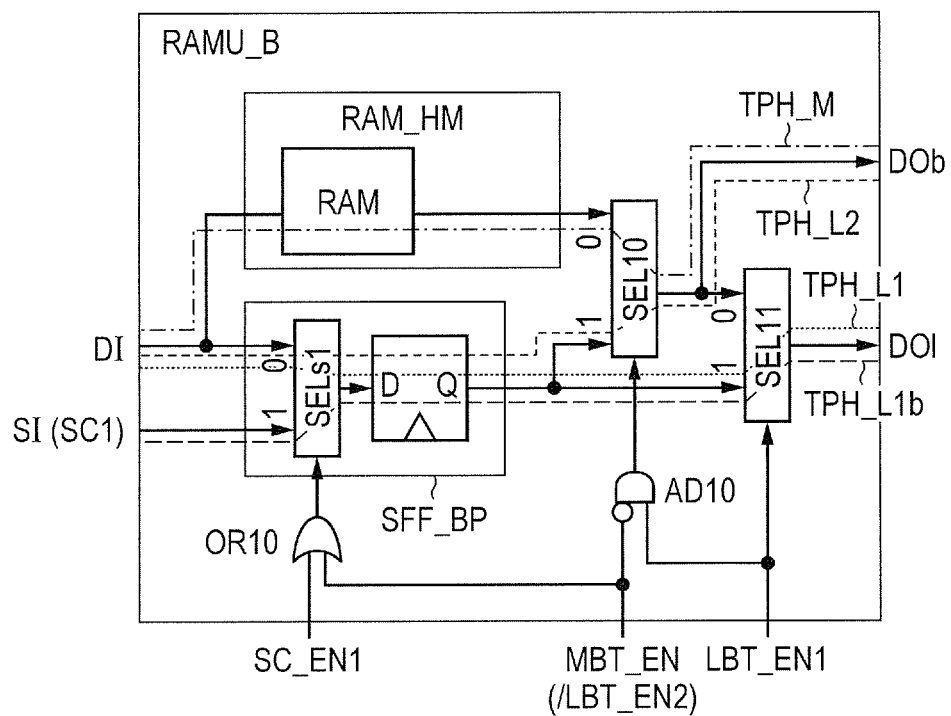
FIG. 8B is a diagram illustrating an operation example in an LBIST mode and a simultaneous test mode in FIG. 8A.

FIG. 8A is a circuit diagram illustrating a schematic configuration example of a memory circuit unit in the semiconductor device of FIG. 1, in a semiconductor device according to the second embodiment of the present invention. FIG. 8B is a diagram illustrating an operation example in the LBIST mode and in the simultaneous test mode in FIG. 8A. FIG. 9 is a diagram illustrating state examples of various control signals in FIG. 8A.

As illustrated in FIG. 8A, the memory circuit unit RAMU_B illustrated in FIG. 8A has the specific examples of the path switch circuit PSW and the decoder DEC in the memory circuit unit RAMU_A of FIG. 6. The path switch circuit PSW of FIG. 6 is configured with two selection circuits SEL10 and SEL11 in FIG. 8A, and the decoder DEC of FIG. 6 is configured with an OR calculation circuit OR10 and an AND calculation circuit AD10 of FIG. 8A.

The selection circuit SEL10 selects an output signal of the memory circuit RAM or an output signal of the scan flip flop circuit SFF_BP for bypass. The selection circuit SEL11 selects an output signal of the selection circuit SEL10 or an output signal of the scan flip flop circuit SFF_BP for bypass. The OR calculation circuit OR10 performs an OR calculation for the scan enable signal SC_EN1 and the MBIST enable signal MBT_EN, and controls the selection circuit SELs1 using a calculation result. The AND calculation circuit AD10 performs an AND calculation for an inversion signal of the MBIST enable signal MBT_EN and the LBIST enable signal LBT_EN1, and controls the selection circuit SEL10 using this calculation result. The selection circuit SEL11 is controlled with the LBIST enable signal LBT_EN1.

As illustrated in FIG. 9, in the LBIST mode, the LBIST enable signals LBT_EN1 and LBT_EN2 are both "1" (assertion level), the MBIST enable signal MBT_EN is "0" (negate level), and the scan enable signal SC_EN1 is controlled appropriately between 0/1, to perform a usual scan test. In the simultaneous test mode, the LBIST enable signal LBT_EN1 and the MBIST enable signal MBT_EN are both "1" (assertion level), the LBIST enable signal LBT_EN2 is "0" (negate level), and the scan enable signal SC_EN1 is fixed to "1" as described in FIG. 6B.

In a user mode after completion of the self-test, the LBIST enable signals LBT_EN1 and LBT_EN2 and the MBIST enable signal MBT_EN are both "0" (negate level), and the scan enable signal SC_EN1 is fixed to "0". The MBIST and the LBIST for the scan chain SC2 (that is, the MBIST circuit MBT) are not simultaneously executed. When one the MBIST enable signal MBT_EN and the LBIST enable signal LBT_EN2 is "1" (assertion level), the other one thereof is "0" (negate level). Thus, both of the signals are not "1" at the same time.

In FIG. 8B, in the LBIST mode, based on FIG. 9, the selection circuit SELs1 for scan is controlled with the scan enable signal SC_EN1 of 0/1, and the selection circuits SEL10 and SEL11 both select an output signal of the scan flip flop circuit SFF_BP for bypass. As a result, in the capture operation, the signal transmission path TPH_L1 is tested in the scan chain SC1, and the signal transmission path TPH_L2 is tested in the scan chain SC2.

In the simultaneous test mode, based on FIG. 9, the selection circuit SELs1 for scan is fixed to "1", the selection circuit SEL10 selects an output signal of the memory circuit RAM, and the selection circuit SEL11 selects an output signal of the scan flip flop circuit SFF_BP for bypass. As a result, in the scan chain SC1, in the capture operation, the signal transmission path TPH_L1b is tested. Concurrently with this, the MBIST circuit executes the MBIST for the memory circuit RAM through the signal transmission path TPH_M. In this manner, because the signal transmission path TPH_L1b and the signal transmission path TPH_M are not duplicated, the LBIST and the MBIST do not interfere with each other.

Figure 10A:
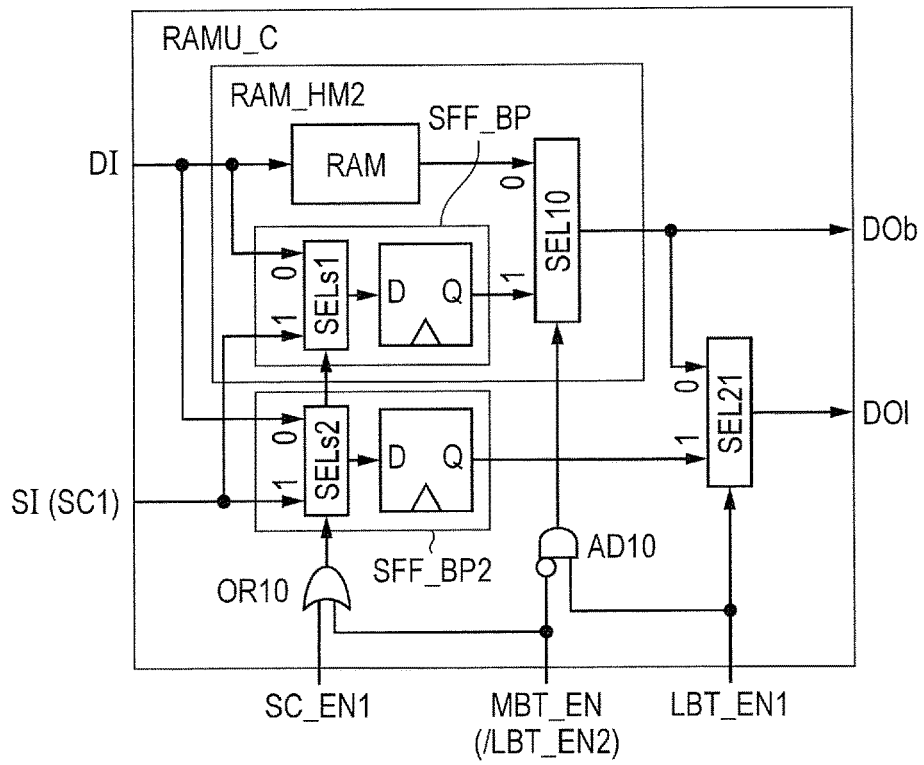
FIG. 10A is a circuit diagram illustrating another schematic configuration example of the memory circuit unit in the semiconductor device of FIG. 1, in the semiconductor device according to the second embodiment of the present invention.
Figure 10B:
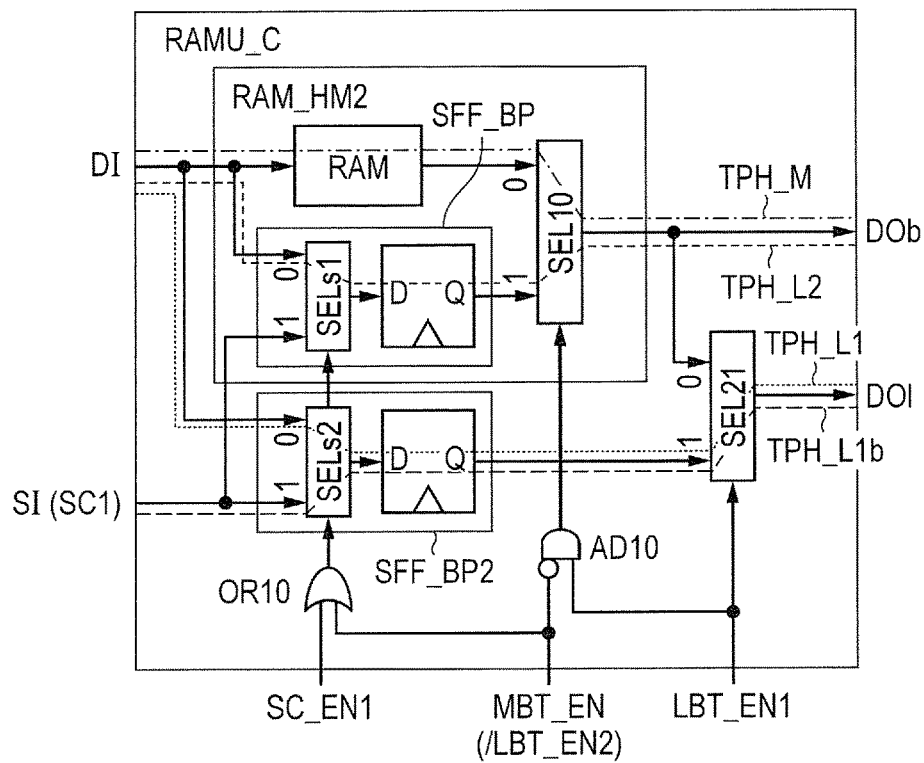
FIG. 10B is a diagram illustrating an operation example in an LBIST mode and a simultaneous test mode in FIG. 10A.

FIG. 10A is a circuit diagram illustrating another schematic configuration example of the memory circuit unit in the semiconductor device of FIG. 1, in the semiconductor device according to the second embodiment of the present invention. FIG. 10B is a diagram illustrating an operation example in the LBIST mode and the simultaneous test mode in FIG. 10A. As compared with the memory circuit RAMU_B of FIG. 8A, a memory circuit unit RAMU_C illustrated in FIG. 10A has another scan flip flop circuit SFF_BP2 for bypass added therein, and includes a selection circuit SEL21 instead of the selection circuit SEL11.

As illustrate in FIG. 10A, in addition to the memory circuit RAM, the scan flip flop circuit SFF_BP for bypass illustrated in FIG. 8A and the selection circuit SEL10 may be implemented as a hard macro RAM_HM2 in advance. FIG. 10A is a configuration example of a memory circuit unit when this hard macro is used. The scan flip flop circuit SFF_BP2 for bypass includes the selection circuit SELs2 for scan controlled by the OR calculation circuit OR10 like the case of the selection circuit SELs1 for scan. Then, the scan flip flop circuit SFF_BP2 for bypass selectively latches an input signal D1 for the memory circuit RAM or a scan-in signal SI (that is, an output signal of the scan flip flop circuit in the scan chain SC1) as the same as the scan-in signal of the scan flip flop circuit SFF_BP for bypass.

Like the case of FIG. 8A, the selection circuit SEL10 selects an output signal of the memory circuit RAM or an output signal of the scan flip flop circuit SFF_BP for bypass, based on a calculation result of the AND calculation circuit AD10. The selection circuit SEL21 selects an output signal of the selection circuit SEL10 or an output signal of the scan flip flop circuit SFF_BP2 for bypass, based on the scan enable signal LBT_EN1.

In FIG. 10B, in the LBIST mode, based on FIG. 9, the selection circuits SELs1 and SELs2 for scan are controlled with the scan enable signal SC_EN1 between 0/1. The selection circuit SEL10 selects an output signal of the scan flip flop circuit SFF_BP for bypass, and the selection circuit SEL21 selects an output signal of the scan flip flop circuit SF_BP2 for bypass. As a result, in the capture operation, the signal transmission path TPH_L1 is tested in the scan chain SC1, and the signal transmission path TPH_L2 is tested in the scan chain SC2.

In the simultaneous test mode, based on FIG. 9, the selection circuits SELs1 and SELs2 for scan are fixed to "1", the selection circuit SEL10 selects an output signal of the memory circuit RAM, and the selection circuit SEL21 selects an output signal of the scan flip flop circuit SFF_BP2 for bypass. As a result, in the scan chain SC1, in the capture operation, the signal transmission path TPH_L1b is tested. Concurrently with this, the MBIST circuit executes the MBIST of the memory circuit RAM through the signal transmission path TPH_M. In this manner, because the signal transmission path TPH_L1b and the signal transmission path TPH_M are not duplicated, the LBIST and the MBIST do not interfere with each other.

Figure 11A:
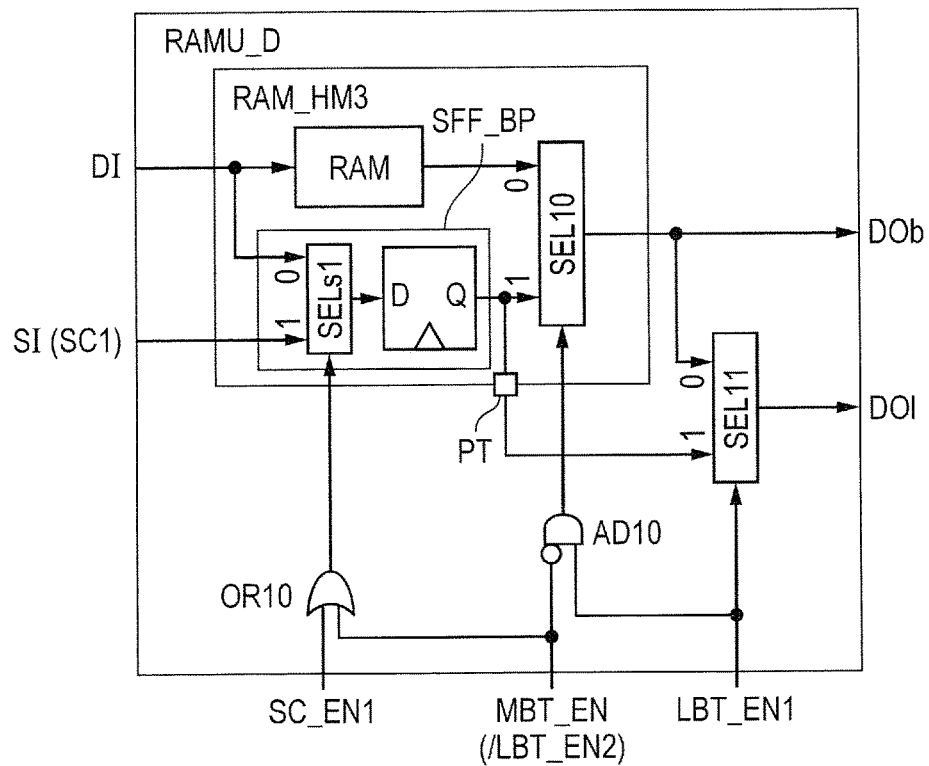
FIG. 11A is a circuit diagram illustrating a still another schematic configuration example of the memory circuit unit in the semiconductor device of FIG. 1, in the semiconductor device according to the second embodiment of the present invention.
Figure 11B:
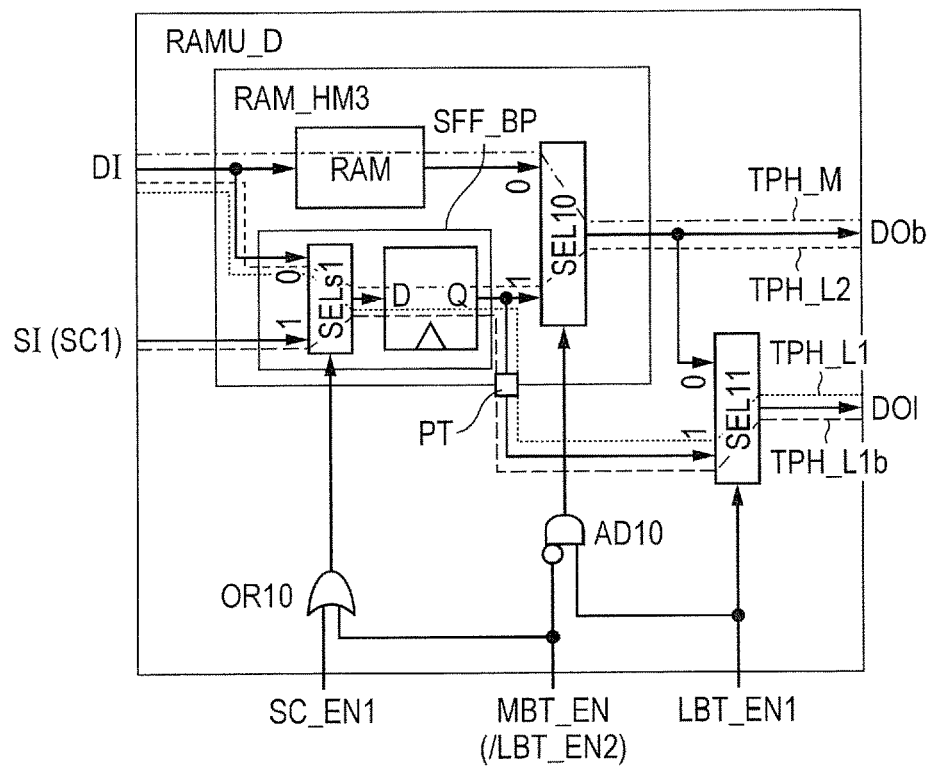
FIG. 11B is a diagram illustrating an operation example in an LBIST mode and a simultaneous test mode in FIG. 11A.

FIG. 11A is a circuit diagram illustrating still another schematic configuration example of the memory circuit unit in the semiconductor device of FIG. 1, in the semiconductor device according to the second embodiment of the present invention. FIG. 11B is a diagram illustrating an operation example in the LBIST mode and the simultaneous test mode in FIG. 11A. A memory circuit unit RAMU_D illustrated in FIG. 11A includes the same circuit configuration as that of FIG. 8A, and performs the same operation as that of FIG. 8B. Unlike the case of FIG. 8A, the memory circuit RAM, the scan flip flop circuit SFF_BP for bypass, and the selection circuit SEL10 are formed in a hard macro RAM_HM3.

Unlike the hard macro RAM_HM2 illustrated in FIG. 10A, this hard macro RAM_HM3 includes a port PT for drawing out an output signal of the scan flip flop circuit SFF_BP for bypass, to the outside of the hard macro RAM_HM3. With this port PT, as compared with the configuration example of FIG. 10A, it is possible to reduce the size of the circuit of the memory circuit unit.

<<Main Effect of Second Embodiment>>

Accordingly, the same effect as that of the first embodiment can be attained, with the semiconductor device of the second embodiment. Further, even when the memory circuit RAM is configured with any of the various hard macros, it is possible apply the method of the first embodiment.

Third Embodiment

<<Configuration of Semiconductor Device (Modification)>>

Figure 12:
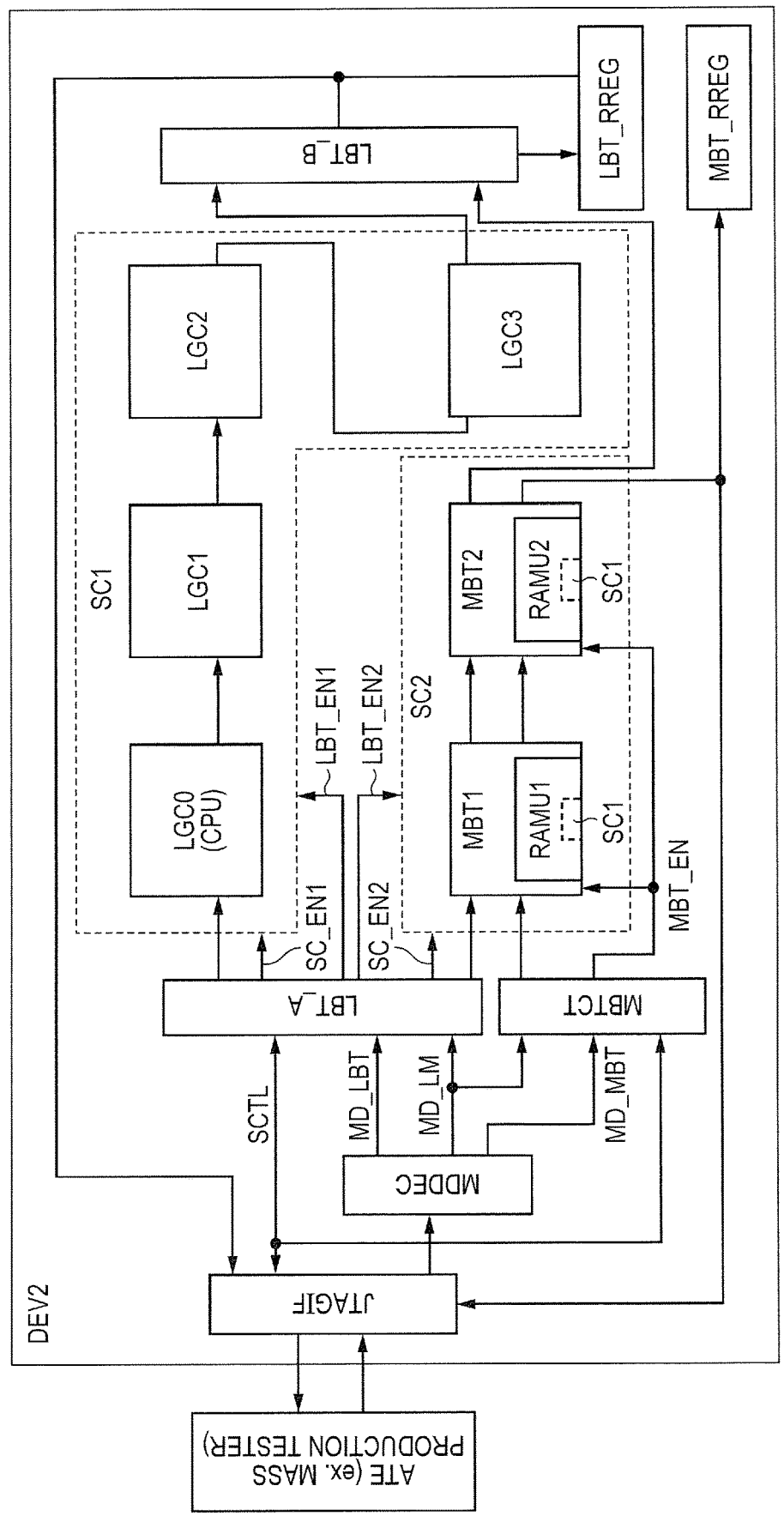
FIG. 12 is a schematic diagram illustrating a configuration example of the main part of a semiconductor device according to the third embodiment of the present invention.

FIG. 12 is a schematic diagram illustrating a configuration example of the main part of a semiconductor device according to the third embodiment of the present invention. As compared with the semiconductor device DEV illustrated in FIG. 1, a semiconductor device DEV2 illustrated in FIG. 12 has a configuration in which the POST circuit PSTC and the system control circuit SYSCT of FIG. 1 are replaced by a JTAG interface circuit JTAGIF and a mode decoder MDDEC. The JTAG interface circuit JTAGIF performs communication with the external of the device based on the JTAG standard. In this example, the JTAG interface circuit JTAGIF performs communication with a test device ATE, such as a tester mass production provided outside the device.

The mode decoder MDDEC generates an LBIST mode signal MD_LBT, an MBIST mode signal MD_MBT, and a simultaneous test mode signal MD_LM, in response to an instruction through the JTAG interface circuit JTAGIF from the outside of the unit. Like the case of the first embodiment, in response to an LBIST mode signal MD_LBT, the LBIST circuits LBT_A and LBT_B are set to the LBIST mode, and in response to a simultaneous test mode signal MD_LM, they are set to the simultaneous test mode. The MBIST control circuit MBTCT and the MBIST circuits MBT1 and MBT2 are set to the simultaneous test mode, in response to a simultaneous test mode signal MD_LM, and are set to the simultaneous test mode, in response to a simultaneous test mode MD_LM. Further, they are set to the MBIST mode as the same as the cases of FIG. 14 to FIG. 16, in response to a MBIST mode signal MD_MBT.

Like the case of FIG. 2, the test device ATE issues, for example, either a start instruction for the LBIST mode or a start instruction for the simultaneous test mode to the mode decoder MDDEC. When either test is completed, it issues the other start instruction to the mode decoder MDDEC. The test device ATE receives completion notification regarding the test in accordance with the LBIST mode or the simultaneous test mode to the LBIST circuit LBT_A or the MBIST control circuit MBTCT, and acquires a test result of each mode from the result storage register LBT_RREG for LBIST and the result storage register MBT_RREG for MBIST. Further, the test device ATE may issue a start instruction of the MBIST mode, as needed.

<<Main Effect of Third Embodiment>>

Accordingly, using the semiconductor device of the third embodiment, during mass production (at the time of a test before shipping), the simultaneous test mode can be used, and it is possible to reduce the time for a test during mass production (that is, to reduce the test cost). The third embodiment may be combined with the first embodiment. That is, in FIG. 12, by providing the POST circuit PSTC and the system control circuit SYSCT of FIG. 1, it is possible to use the simultaneous test mode both for the test after shipping (so-called a field test) and the test before shipping.

The inventions by the present inventors have specifically been described based on the preferred embodiments. The present invention is not limited to the preferred embodiments, and various changes may be made without departing from the scope thereof. For example, the above-described embodiments have specifically been described for easy description of the present invention, and are not to limit to any of those including the entire above-described configuration. A part of the configuration of one embodiment may possibly be replaced by the configuration of another embodiment, and the configuration of one embodiment may be added to the configuration of another embodiment. A part of the configuration of each embodiment may be added to, deleted from, or replaced by the configuration of another embodiment.

What is claimed is:

1. A semiconductor device configured with one semiconductor chip, comprising:
   a memory circuit unit which includes a memory circuit and an interface for testing the memory circuit;
   a logic circuit which performs a predetermined logical operation;
   a memory BIST (Built In Self Test) circuit which tests the memory circuit; and
   a logic BIST circuit which tests the logic circuit and the memory BIST circuit,
   wherein at least a part of the logic circuit is incorporated in a first scan chain,
   wherein the memory BIST circuit is incorporated in a second scan chain,
   wherein the logic BIST circuit concurrently executes a first scan test for the first scan chain as a target and a second scan test for the second scan chain as a target, when it is set to a first test mode, and executes the first scan test without executing the second scan test, when it is set to a second test mode,
   wherein the memory BIST circuit executes a test for the memory circuit concurrently with the first scan test, when it is set to the second test mode,
   wherein a time for executing the first scan test is longer than a time for executing the second scan test,
   wherein the logic BIST circuit completes a test with the first test mode, at a stage where the second scan test has been completed, and
   wherein the logic circuit incorporated in the first scan chain includes a memory pre-stage logic circuit issuing an instruction for accessing to the memory circuit and a memory post-stage logic circuit to which read data from the memory circuit is input.

2. The semiconductor device according to claim 1, further comprising
   a POST (Power On Self Test) circuit which sequentially sets the first test mode and the second test mode, in response to power supply of the semiconductor device.

3. The semiconductor device according to claim 1,
   wherein the memory circuit unit includes
   a scan flip flop circuit for bypass which has a function for bypassing an input and/or an output of the memory circuit, and selectively latches an input signal for the memory circuit or a scan-in signal, and
   a path switch circuit which transmits an output signal of the scan flip flop circuit for bypass to the memory BIST circuit and the memory post-stage logic circuit, when it is set to the first test mode, transmits an output signal of the scan flip flop circuit for bypass to the memory post-stage logic circuit, when it is set to the second test mode, and transmits an output signal of the memory circuit to the memory BIST circuit,
   wherein the scan-in signal of the scan flip flop circuit for bypass is an output signal of any scan flip flop circuit in the logic circuit incorporated in the first scan chain, and
   wherein the scan flip flop circuit for bypass latches the scan-in signal, when it is set to the second test mode.

4. The semiconductor device according to claim 3, further comprising:
   a selection circuit which selects a signal from the memory pre-stage logic circuit or a signal from the memory BIST circuit, and outputs the selected signal to the memory circuit and the scan flip flop circuit for bypass.

5. The semiconductor device according to claim 1, further comprising:
   a JTAG interface circuit which performs communication with an external device based on a JTAG standard, and
   a mode decoder which sets the second test mode, in response to an instruction from the external device through the JTAG interface circuit.

6. A semiconductor device which is configured with one semiconductor chip, comprising:
   a memory circuit unit which includes a memory circuit and an interface for testing the memory circuit;
   a logic circuit which includes a memory pre-stage logic circuit issuing an instruction for accessing to the memory circuit and a memory post-stage logic circuit to which read data from the memory circuit is input, and performs a predetermined logical operation;
   a memory BIST (Built In Self Test) circuit which tests the memory circuit; and a logic BIST circuit which tests the logic circuit and the memory BIST circuit, wherein the memory circuit includes:
- a first scan flip flop circuit for bypass which has a function for bypassing an input and/or an output of the memory circuit, and selectively latches an input signal for the memory circuit or a scan-in signal, and
- a path switch circuit which transmits an output signal of the first scan flip flop circuit for bypass to the memory BIST circuit and the memory post-stage logic circuit, when it is set to a first test mode, transmits an output signal of the first scan flip flop circuit for bypass to the memory post-stage logic circuit, when it is set to a second test mode, and transmits an output signal of the memory circuit to the memory BIST circuit.

7. The semiconductor device according to claim 6,
wherein the path switch circuit includes
- a first selection circuit which selects an output signal of the memory circuit or an output signal of the first scan flip flop circuit for bypass, and
- a second selection circuit which selects an output signal of the first selection circuit or an output signal of the first scan flip flop circuit for bypass.

8. The semiconductor device according to claim 7,
wherein the memory circuit, the first scan flip flop circuit for bypass, and the first selection circuit are configured with a hard macro.

9. The semiconductor device according to claim 6, further comprising:
- a second scan flip flop circuit for bypass which selectively latches an input signal for the memory circuit or a scan-in signal;
- a first selection circuit which selects an output signal of the memory circuit or an output signal of the first scan flip flop circuit for bypass; and
- a second selection circuit which selects an output signal of the first selection circuit or an output signal of the second scan flip flop circuit.

10. The semiconductor device according to claim 6,
wherein the first scan flip flop circuit for bypass latches the scan-in signal, when it is set to the second test mode.

11. A test method for a semiconductor device which is configured with one semiconductor chip, the semiconductor device comprising:
- a memory circuit unit which includes a memory circuit and an interface for testing the memory circuit;
- a logic circuit which performs a predetermined logical operation;
- a memory BIST (Built In Self Test) circuit which tests the memory circuit; and
- a logic BIST circuit which tests the logic circuit and the memory BIST circuit, wherein at least a part of the logic circuit is incorporated in a first scan chain, wherein the memory BIST circuit is incorporated in a second scan chain, wherein the test method has
- a first step, by the logic BIST circuit, of concurrently executing a first scan test for the first scan chain as a target and a second scan test for the second scan chain as a target, and
- a second step, by the logic BIST circuit, of executing the first scan test without executing the second scan test, and, by the memory BIST circuit, of executing a test for the memory circuit concurrently with the first scan test, wherein a time for executing the first scan test is longer than a time for executing the second scan test, wherein the first step is completed at a stage where the second scan test is completed, and wherein the logic circuit incorporated in the first scan chain includes a memory pre-stage logic circuit issuing an instruction for accessing to the memory circuit and a memory post-stage logic circuit to which read data from the memory circuit is input.

12. The test method for the semiconductor device according to claim 11,
wherein the first step and the second step are performed in response to detecting that power is supplied to the semiconductor device.

13. The test method for the semiconductor device according to claim 11,
wherein the first step and the second step are executed in response to an instruction from an external device, during mass production of the semiconductor device.

* * * * *